(12) United States Patent
Visser et al.

(10) Patent No.: US 9,337,446 B2
(45) Date of Patent: May 10, 2016

(54) ENCAPSULATED RGB OLEDS HAVING ENHANCED OPTICAL OUTPUT

(75) Inventors: Robert Jan Visser, Menlo Park, CA (US); Lorenza Moro, San Carlos, CA (US)

(73) Assignee: Samsung Display Co., Ltd., Yongin (KR)

( * ) Notice: Subject to any disclaimer, the term of this patent is extended or adjusted under 35 U.S.C. 154(b) by 460 days.

(21) Appl. No.: 12/341,134

(22) Filed: Dec. 22, 2008

(65) Prior Publication Data

US 2010/0156277 A1 Jun. 24, 2010

(51) Int. Cl.
*H01L 51/56* (2006.01)
*H01L 51/50* (2006.01)
*H01L 51/52* (2006.01)

(52) U.S. Cl.
CPC ........ *H01L 51/5275* (2013.01); *H01L 51/5237* (2013.01); *H01L 51/5234* (2013.01); *H01L 2251/558* (2013.01)

(58) Field of Classification Search
CPC ..................................... H01L 51/524–51/5278
USPC .................................................. 313/500–512
See application file for complete search history.

(56) References Cited

U.S. PATENT DOCUMENTS

| | | | |
|---|---|---|---|
| 2,382,432 A | 8/1945 | McManus et al. | |
| 2,384,500 A | 9/1945 | Stoll | |
| 3,475,307 A | 10/1969 | Knox et al. | |
| 3,496,427 A | 2/1970 | Lee | |
| 3,607,365 A | 9/1971 | Lindlof | |
| 3,661,117 A | 5/1972 | Cornelius et al. | |
| 4,061,835 A | 12/1977 | Poppe et al. | |
| 4,098,965 A | 7/1978 | Kinsman | |
| 4,266,223 A | 5/1981 | Frame | |
| 4,283,482 A | 8/1981 | Hattori et al. | |
| 4,313,254 A | 2/1982 | Feldman et al. | |
| 4,426,275 A | 1/1984 | Meckel et al. | |
| 4,521,458 A | 6/1985 | Nelson | |
| 4,537,814 A | 8/1985 | Itoh et al. | |
| 4,555,274 A | 11/1985 | Kitajima et al. | |
| 4,557,978 A | 12/1985 | Mason | |
| 4,572,842 A | 2/1986 | Dietrich et al. | |

(Continued)

FOREIGN PATENT DOCUMENTS

| | | |
|---|---|---|
| BE | 704297 | 2/1968 |
| CA | 2 353 506 | 5/2000 |

(Continued)

OTHER PUBLICATIONS

European Examination Report dated Mar. 25, 2010 pertaining to European Application No. 05 791 757.7.

(Continued)

*Primary Examiner* — Mariceli Santiago
(74) *Attorney, Agent, or Firm* — Dinsmore & Shohl LLP

(57) ABSTRACT

Methods of making an integrated barrier stack and optical enhancement layer for protecting and improving the light out coupling of an encapsulated OLED are described. The method includes optimizing the thickness of various layers including the initial inorganic barrier layer and the inorganic barrier layer and polymeric decoupling layer for the barrier stack. The thickness is optimized for at least one of maximum efficiency, minimum dispersion, or minimum spectral shift so that the encapsulated OLED has enhanced light outcoupling compared to the bare OLED.

22 Claims, 22 Drawing Sheets

(56) References Cited

U.S. PATENT DOCUMENTS

| | | |
|---|---|---|
| 4,581,337 A | 4/1986 | Frey et al. |
| 4,624,867 A | 11/1986 | Iijima et al. |
| 4,695,618 A | 9/1987 | Mowrer |
| 4,710,426 A | 12/1987 | Stephens |
| 4,722,515 A | 2/1988 | Ham |
| 4,768,666 A | 9/1988 | Kessler |
| 4,842,893 A | 6/1989 | Yializis et al. |
| 4,843,036 A | 6/1989 | Schmidt et al. |
| 4,855,186 A | 8/1989 | Grolig et al. |
| 4,889,609 A | 12/1989 | Cannella |
| 4,913,090 A | 4/1990 | Harada et al. |
| 4,931,158 A | 6/1990 | Bunshah et al. |
| 4,934,315 A | 6/1990 | Linnebach et al. |
| 4,954,371 A | 9/1990 | Yializis |
| 4,977,013 A | 12/1990 | Ritchie et al. |
| 5,032,461 A | 7/1991 | Shaw et al. |
| 5,036,249 A | 7/1991 | Pike-Biegunski et al. |
| 5,047,131 A | 9/1991 | Wolfe et al. |
| 5,059,861 A | 10/1991 | Littman et al. |
| 5,124,204 A | 6/1992 | Yamashita et al. |
| 5,189,405 A | 2/1993 | Yamashita et al. |
| 5,203,898 A | 4/1993 | Carpenter et al. |
| 5,204,314 A | 4/1993 | Kirlin et al. |
| 5,237,439 A | 8/1993 | Misono et al. |
| 5,260,095 A | 11/1993 | Affinito |
| 5,336,324 A | 8/1994 | Stall et al. |
| 5,344,501 A | 9/1994 | Hashimoto |
| 5,354,497 A | 10/1994 | Fukuchi et al. |
| 5,356,947 A | 10/1994 | Ali et al. |
| 5,357,063 A | 10/1994 | House et al. |
| 5,376,467 A | 12/1994 | Abe et al. |
| 5,393,607 A | 2/1995 | Kawasaki et al. |
| 5,395,644 A | 3/1995 | Affinito |
| 5,402,314 A | 3/1995 | Amago et al. |
| 5,427,638 A | 6/1995 | Goetz et al. |
| 5,440,446 A | 8/1995 | Shaw et al. |
| 5,451,449 A | 9/1995 | Shetty et al. |
| 5,461,545 A | 10/1995 | Leroy et al. |
| 5,464,667 A | 11/1995 | Kohler et al. |
| 5,510,173 A | 4/1996 | Pass et al. |
| 5,512,320 A | 4/1996 | Turner et al. |
| 5,536,323 A | 7/1996 | Kirlin et al. |
| 5,547,508 A | 8/1996 | Affinito |
| 5,554,220 A | 9/1996 | Forrest et al. |
| 5,576,101 A | 11/1996 | Saitoh et al. |
| 5,607,789 A | 3/1997 | Treger et al. |
| 5,620,524 A | 4/1997 | Fan et al. |
| 5,629,389 A | 5/1997 | Roitman et al. |
| 5,652,192 A | 7/1997 | Matson et al. |
| 5,654,084 A | 8/1997 | Egert |
| 5,660,961 A | 8/1997 | Yu |
| 5,665,280 A | 9/1997 | Tropsha |
| 5,681,615 A | 10/1997 | Affinito et al. |
| 5,681,666 A | 10/1997 | Treger et al. |
| 5,684,084 A | 11/1997 | Lewin et al. |
| 5,686,360 A | 11/1997 | Harvey, III et al. |
| 5,693,956 A | 12/1997 | Shi et al. |
| 5,695,564 A | 12/1997 | Imahashi |
| 5,711,816 A | 1/1998 | Kirlin et al. |
| 5,725,909 A | 3/1998 | Shaw et al. |
| 5,731,661 A | 3/1998 | So et al. |
| 5,736,207 A | 4/1998 | Walther et al. |
| 5,747,182 A | 5/1998 | Friend et al. |
| 5,757,126 A | 5/1998 | Harvey, III et al. |
| 5,759,329 A | 6/1998 | Krause et al. |
| 5,771,177 A | 6/1998 | Tada et al. |
| 5,771,562 A | 6/1998 | Harvey, III et al. |
| 5,782,355 A | 7/1998 | Katagiri et al. |
| 5,792,550 A | 8/1998 | Phillips et al. |
| 5,795,399 A | 8/1998 | Hasegawa et al. |
| 5,811,177 A | 9/1998 | Shi et al. |
| 5,811,183 A | 9/1998 | Shaw et al. |
| 5,821,692 A | 10/1998 | Rogers et al. |
| 5,844,363 A | 12/1998 | Gu et al. |
| 5,861,658 A | 1/1999 | Cronin et al. |
| 5,869,791 A | 2/1999 | Young |
| 5,872,355 A | 2/1999 | Hueschen |
| 5,891,554 A | 4/1999 | Hosokawa et al. |
| 5,895,228 A | 4/1999 | Biebuyck et al. |
| 5,902,641 A | 5/1999 | Affinito et al. |
| 5,902,688 A | 5/1999 | Antoniadis et al. |
| 5,904,958 A | 5/1999 | Dick et al. |
| 5,912,069 A | 6/1999 | Yializis et al. |
| 5,919,328 A | 7/1999 | Tropsha et al. |
| 5,920,080 A | 7/1999 | Jones |
| 5,922,161 A | 7/1999 | Wu et al. |
| 5,929,562 A | 7/1999 | Pichler |
| 5,934,856 A | 8/1999 | Asakawa et al. |
| 5,945,174 A | 8/1999 | Shaw et al. |
| 5,948,552 A | 9/1999 | Antoniadis et al. |
| 5,952,778 A | 9/1999 | Haskal et al. |
| 5,955,161 A | 9/1999 | Tropsha |
| 5,965,907 A | 10/1999 | Huang et al. |
| 5,968,620 A | 10/1999 | Harvey et al. |
| 5,994,174 A | 11/1999 | Carey et al. |
| 5,996,498 A | 12/1999 | Lewis |
| 6,004,660 A | 12/1999 | Topolski et al. |
| 6,013,337 A | 1/2000 | Knors |
| 6,040,017 A | 3/2000 | Mikhael et al. |
| 6,045,864 A | 4/2000 | Lyons et al. |
| 6,066,826 A | 5/2000 | Yializis |
| 6,083,313 A | 7/2000 | Venkatraman et al. |
| 6,083,628 A | 7/2000 | Yializis |
| 6,084,702 A | 7/2000 | Byker et al. |
| 6,087,007 A | 7/2000 | Fujii et al. |
| 6,092,269 A | 7/2000 | Yializis et al. |
| 6,106,627 A | 8/2000 | Yializis et al. |
| 6,117,266 A | 9/2000 | Horzel et al. |
| 6,118,218 A | 9/2000 | Yializis et al. |
| 6,146,225 A | 11/2000 | Sheates et al. |
| 6,146,462 A | 11/2000 | Yializis et al. |
| 6,150,187 A | 11/2000 | Zyung et al. |
| 6,165,566 A | 12/2000 | Tropsha |
| 6,178,082 B1 | 1/2001 | Farooq et al. |
| 6,195,142 B1 | 2/2001 | Gyotoku et al. |
| 6,198,217 B1 | 3/2001 | Suzuki et al. |
| 6,198,220 B1 | 3/2001 | Jones et al. |
| 6,203,898 B1 | 3/2001 | Kohler et al. |
| 6,207,238 B1 | 3/2001 | Affinito |
| 6,207,239 B1 | 3/2001 | Affinito |
| 6,214,422 B1 | 4/2001 | Yializis |
| 6,217,947 B1 | 4/2001 | Affinito |
| 6,224,948 B1 | 5/2001 | Affinito |
| 6,228,434 B1 | 5/2001 | Affinito |
| 6,228,436 B1 | 5/2001 | Affinito |
| 6,231,939 B1 | 5/2001 | Shaw et al. |
| 6,264,747 B1 | 7/2001 | Shaw et al. |
| 6,268,695 B1 | 7/2001 | Affinito |
| 6,274,204 B1 | 8/2001 | Affinito |
| 6,322,860 B1 | 11/2001 | Stein et al. |
| 6,333,065 B1 | 12/2001 | Arai et al. |
| 6,348,237 B2 | 2/2002 | Kohler et al. |
| 6,350,034 B1 | 2/2002 | Fleming et al. |
| 6,352,777 B1 | 3/2002 | Bulovic et al. |
| 6,358,570 B1 | 3/2002 | Affinito |
| 6,361,885 B1 | 3/2002 | Chou |
| 6,397,776 B1 | 6/2002 | Yang et al. |
| 6,413,645 B1 | 7/2002 | Graff et al. |
| 6,416,872 B1 | 7/2002 | Maschwitz |
| 6,420,003 B2 | 7/2002 | Shaw et al. |
| 6,436,544 B1 | 8/2002 | Veyrat et al. |
| 6,460,369 B2 | 10/2002 | Hosokawa |
| 6,465,953 B1 | 10/2002 | Duggal |
| 6,468,595 B1 | 10/2002 | Mikhael et al. |
| 6,469,437 B1 | 10/2002 | Parthasarathy et al. |
| 6,469,438 B2 * | 10/2002 | Fukuoka et al. ............... 313/504 |
| 6,492,026 B1 | 12/2002 | Graff et al. |
| 6,497,598 B2 | 12/2002 | Affinito |
| 6,497,924 B2 | 12/2002 | Affinito et al. |
| 6,509,065 B2 | 1/2003 | Affinito |
| 6,512,561 B1 | 1/2003 | Terashita et al. |
| 6,522,067 B1 | 2/2003 | Graff et al. |
| 6,537,688 B2 | 3/2003 | Silvernail et al. |
| 6,544,600 B2 | 4/2003 | Affinito et al. |

(56) References Cited

U.S. PATENT DOCUMENTS

| | | |
|---|---|---|
| 6,569,515 B2 | 5/2003 | Hebrink et al. |
| 6,570,325 B2 | 5/2003 | Graff et al. |
| 6,570,714 B2 | 5/2003 | Soane et al. |
| 6,573,652 B1 | 6/2003 | Graff et al. |
| 6,576,351 B2 | 6/2003 | Silvernail |
| 6,592,969 B1 | 7/2003 | Burroughes et al. |
| 6,597,111 B2 | 7/2003 | Silvernail et al. |
| 6,613,395 B2 | 9/2003 | Affinito et al. |
| 6,614,057 B2 | 9/2003 | Silvernail et al. |
| 6,624,568 B2 | 9/2003 | Silvernail |
| 6,627,267 B2 | 9/2003 | Affinito |
| 6,628,071 B1 | 9/2003 | Su |
| 6,653,780 B2 | 11/2003 | Sugimoto et al. |
| 6,656,537 B2 | 12/2003 | Affinito et al. |
| 6,664,137 B2 | 12/2003 | Weaver |
| 6,681,716 B2 | 1/2004 | Schaepkens |
| 6,703,780 B2 | 3/2004 | Shiang et al. |
| 6,710,542 B2 | 3/2004 | Chun et al. |
| 6,734,625 B2 | 5/2004 | Vong et al. |
| 6,737,753 B2 | 5/2004 | Kumar et al. |
| 6,743,524 B2 | 6/2004 | Schaepkens |
| 6,749,940 B1 | 6/2004 | Terasaki et al. |
| 6,765,351 B2 | 7/2004 | Forrest et al. |
| 6,777,871 B2 | 8/2004 | Duggal et al. |
| 6,803,245 B2 | 10/2004 | Auch et al. |
| 6,811,829 B2 | 11/2004 | Affinito et al. |
| 6,815,887 B2 | 11/2004 | Lee et al. |
| 6,818,291 B2 | 11/2004 | Funkenbusch et al. |
| 6,822,391 B2 | 11/2004 | Yamazaki et al. |
| 6,827,788 B2 | 12/2004 | Takahashi |
| 6,835,950 B2 | 12/2004 | Brown et al. |
| 6,836,070 B2 | 12/2004 | Chung et al. |
| 6,837,950 B1 | 1/2005 | Berard |
| 6,852,356 B2 | 2/2005 | Nishikawa |
| 6,864,629 B2 | 3/2005 | Miyaguchi et al. |
| 6,866,901 B2 | 3/2005 | Burrows et al. |
| 6,867,539 B1 | 3/2005 | McCormick et al. |
| 6,872,114 B2 | 3/2005 | Chung et al. |
| 6,872,248 B2 | 3/2005 | Mizutani et al. |
| 6,872,428 B2 | 3/2005 | Yang et al. |
| 6,878,467 B2 | 4/2005 | Chung et al. |
| 6,888,305 B2 | 5/2005 | Weaver |
| 6,888,307 B2 | 5/2005 | Silvernail et al. |
| 6,891,330 B2 | 5/2005 | Duggal et al. |
| 6,897,474 B2 | 5/2005 | Brown et al. |
| 6,897,607 B2 | 5/2005 | Sugimoto et al. |
| 6,902,905 B2 | 6/2005 | Burson et al. |
| 6,905,769 B2 | 6/2005 | Komada |
| 6,911,667 B2 | 6/2005 | Pichler et al. |
| 6,936,131 B2 | 8/2005 | McCormick et al. |
| 6,975,067 B2 | 12/2005 | McCormick et al. |
| 6,998,648 B2 | 2/2006 | Silvernail |
| 7,002,294 B2 | 2/2006 | Forrest et al. |
| 7,012,363 B2 | 3/2006 | Weaver et al. |
| 7,015,640 B2 | 3/2006 | Schaepkens et al. |
| 7,018,713 B2 | 3/2006 | Padiyath et al. |
| 7,029,765 B2 | 4/2006 | Kwong et al. |
| 7,112,351 B2 | 9/2006 | Affinito |
| 7,166,007 B2 | 1/2007 | Auch et al. |
| 7,198,832 B2 | 4/2007 | Burrows et al. |
| 7,221,093 B2 | 5/2007 | Auch et al. |
| 7,255,823 B1 | 8/2007 | Guenther et al. |
| 7,621,794 B2 | 11/2009 | Lee et al. |
| 2001/0015074 A1 | 8/2001 | Hosokawa |
| 2001/0015620 A1 | 8/2001 | Affinito |
| 2002/0022156 A1 | 2/2002 | Bright |
| 2002/0025444 A1 | 2/2002 | Hebrink et al. |
| 2002/0068143 A1 | 6/2002 | Silvernail |
| 2002/0069826 A1 | 6/2002 | Hunt et al. |
| 2002/0096114 A1 | 7/2002 | Carducci et al. |
| 2002/0102363 A1 | 8/2002 | Affinito et al. |
| 2002/0102818 A1 | 8/2002 | Sandhu et al. |
| 2002/0125822 A1 | 9/2002 | Graff et al. |
| 2002/0139303 A1 | 10/2002 | Yamazaki et al. |
| 2002/0140347 A1 | 10/2002 | Weaver |
| 2003/0038590 A1 | 2/2003 | Silvernail et al. |
| 2003/0085652 A1 | 5/2003 | Weaver |
| 2003/0098647 A1 | 5/2003 | Silvernail et al. |
| 2003/0124392 A1 | 7/2003 | Bright |
| 2003/0127973 A1 | 7/2003 | Weaver et al. |
| 2003/0184222 A1 | 10/2003 | Nilsson et al. |
| 2003/0197197 A1 | 10/2003 | Brown et al. |
| 2003/0203210 A1 | 10/2003 | Graff et al. |
| 2003/0205845 A1 | 11/2003 | Pichler et al. |
| 2003/0218422 A1 | 11/2003 | Park et al. |
| 2003/0235648 A1 | 12/2003 | Affinito et al. |
| 2004/0002729 A1 | 1/2004 | Zamore |
| 2004/0018305 A1 | 1/2004 | Pagano et al. |
| 2004/0029334 A1 | 2/2004 | Bijker et al. |
| 2004/0031442 A1 | 2/2004 | Yamazaki et al. |
| 2004/0046497 A1 | 3/2004 | Schaepkens et al. |
| 2004/0071971 A1 | 4/2004 | Iacovangelo |
| 2004/0113542 A1 | 6/2004 | Hsiao et al. |
| 2004/0115402 A1 | 6/2004 | Schaepkens |
| 2004/0115859 A1 | 6/2004 | Murayama et al. |
| 2004/0119028 A1 | 6/2004 | McCormick et al. |
| 2004/0175512 A1 | 9/2004 | Schaepkens |
| 2004/0175580 A1 | 9/2004 | Schaepkens |
| 2004/0187999 A1 | 9/2004 | Wilkinson et al. |
| 2004/0209090 A1 | 10/2004 | Iwanaga |
| 2004/0212759 A1 | 10/2004 | Hayashi |
| 2004/0219380 A1 | 11/2004 | Naruse et al. |
| 2004/0229051 A1 | 11/2004 | Schaepkens et al. |
| 2004/0241454 A1 | 12/2004 | Shaw et al. |
| 2004/0263038 A1 | 12/2004 | Ribolzi et al. |
| 2005/0003098 A1 | 1/2005 | Kohler et al. |
| 2005/0006786 A1 | 1/2005 | Sawada |
| 2005/0051094 A1 | 3/2005 | Schaepkens et al. |
| 2005/0079295 A1 | 4/2005 | Schaepkens |
| 2005/0079380 A1 | 4/2005 | Iwanaga |
| 2005/0093001 A1 | 5/2005 | Liu et al. |
| 2005/0093437 A1 | 5/2005 | Ouyang |
| 2005/0094394 A1 | 5/2005 | Padiyath et al. |
| 2005/0095422 A1 | 5/2005 | Sager et al. |
| 2005/0095736 A1 | 5/2005 | Padiyath et al. |
| 2005/0112378 A1 | 5/2005 | Naruse et al. |
| 2005/0122039 A1 | 6/2005 | Satani |
| 2005/0129841 A1 | 6/2005 | McCormick et al. |
| 2005/0133781 A1 | 6/2005 | Yan et al. |
| 2005/0140291 A1 | 6/2005 | Hirakata et al. |
| 2005/0146267 A1 | 7/2005 | Lee et al. |
| 2005/0174045 A1 | 8/2005 | Lee et al. |
| 2005/0176181 A1 | 8/2005 | Burrows et al. |
| 2005/0212419 A1 | 9/2005 | Vazan et al. |
| 2005/0224935 A1 | 10/2005 | Schaepkens et al. |
| 2005/0238846 A1 | 10/2005 | Arakatsu et al. |
| 2005/0239294 A1 | 10/2005 | Rosenblum et al. |
| 2006/0003474 A1 | 1/2006 | Tyan et al. |
| 2006/0006799 A1 | 1/2006 | Yamazaki et al. |
| 2006/0028128 A1 | 2/2006 | Ohkubo |
| 2006/0061272 A1 | 3/2006 | McCormick et al. |
| 2006/0062937 A1 | 3/2006 | Padiyath et al. |
| 2006/0063015 A1 | 3/2006 | McCormick et al. |
| 2006/0216951 A1 | 9/2006 | Moro et al. |
| 2006/0246811 A1 | 11/2006 | Winters et al. |
| 2006/0250084 A1 | 11/2006 | Cok et al. |
| 2007/0009674 A1 | 1/2007 | Okubo et al. |
| 2007/0033965 A1 | 2/2007 | Lifson et al. |
| 2007/0049155 A1 | 3/2007 | Moro et al. |
| 2007/0164376 A1 | 7/2007 | Burrows et al. |
| 2007/0187759 A1 | 8/2007 | Lee et al. |
| 2008/0032076 A1 | 2/2008 | Dujardin et al. |
| 2009/0258235 A1 | 10/2009 | Tateishi |
| 2010/0193468 A1 | 8/2010 | Burrows et al. |

FOREIGN PATENT DOCUMENTS

| | | |
|---|---|---|
| CN | 1647247 A | 7/2005 |
| DE | 196 03 746 A1 | 4/1997 |
| DE | 696 15 510 T2 | 6/1997 |
| DE | 10 2004 063 619 A1 | 7/2006 |
| EP | 0 147 696 B1 | 7/1985 |
| EP | 0 299 753 A2 | 1/1989 |
| EP | 0 340 935 A2 | 11/1989 |

(56) References Cited

FOREIGN PATENT DOCUMENTS

| | | |
|---|---|---|
| EP | 0 390 540 B1 | 10/1990 |
| EP | 0 468 440 A2 | 1/1992 |
| EP | 0 547 550 A1 | 6/1993 |
| EP | 0 590 467 A1 | 4/1994 |
| EP | 0 611 037 A1 | 8/1994 |
| EP | 0 722 787 A2 | 7/1996 |
| EP | 0 777 280 A2 | 6/1997 |
| EP | 0 777 281 A2 | 6/1997 |
| EP | 0 787 824 A2 | 6/1997 |
| EP | 0 787 826 A1 | 6/1997 |
| EP | 0 915 105 A1 | 5/1998 |
| EP | 0 916 394 A2 | 5/1998 |
| EP | 0 931 850 A1 | 7/1999 |
| EP | 0 977 469 A2 | 2/2000 |
| EP | 1 021 070 A1 | 7/2000 |
| EP | 1 127 381 | 8/2001 |
| EP | 1 130 420 A2 | 9/2001 |
| EP | 1 278 244 A2 | 1/2003 |
| EP | 1514317 A1 | 3/2005 |
| EP | 1 719 808 A2 | 11/2006 |
| EP | 1 857 270 A1 | 11/2007 |
| GB | 2 210 826 A | 6/1989 |
| JP | S63-96895 | 4/1988 |
| JP | 63136316 | 8/1988 |
| JP | 6418441 | 1/1989 |
| JP | 01041067 | 2/1989 |
| JP | S64-41192 | 2/1989 |
| JP | 02183230 | 7/1990 |
| JP | 3-183759 | 8/1991 |
| JP | 03290375 | 12/1991 |
| JP | 4-14440 | 1/1992 |
| JP | 4-48515 | 2/1992 |
| JP | 04267097 | 9/1992 |
| JP | 06158305 | 11/1992 |
| JP | 5501587 | 3/1993 |
| JP | 5-147678 | 6/1993 |
| JP | 05182759 | 7/1993 |
| JP | 5290972 | 11/1993 |
| JP | 06-136159 | 5/1994 |
| JP | 61-79644 | 6/1994 |
| JP | 06-196260 | 7/1994 |
| JP | 06-223966 | 8/1994 |
| JP | 6234186 A | 8/1994 |
| JP | 07147189 | 6/1995 |
| JP | 07192866 | 7/1995 |
| JP | 8-72188 | 3/1996 |
| JP | 08171988 | 7/1996 |
| JP | 08179292 | 7/1996 |
| JP | 08-203669 | 8/1996 |
| JP | 08325713 | 10/1996 |
| JP | 8-318590 | 12/1996 |
| JP | 09059763 | 4/1997 |
| JP | 09132774 | 5/1997 |
| JP | 09161967 | 6/1997 |
| JP | 9-201897 | 8/1997 |
| JP | 10-725 | 1/1998 |
| JP | 10-013083 | 1/1998 |
| JP | 10312883 | 11/1998 |
| JP | 11040344 | 2/1999 |
| JP | 11-149826 | 6/1999 |
| JP | 11255923 | 9/1999 |
| JP | 200058258 | 2/2000 |
| JP | 2002-151254 | 5/2002 |
| JP | 2003282239 A | 10/2003 |
| JP | 2004-176111 A | 6/2004 |
| JP | 2004-294601 | 10/2004 |
| JP | 2004-309932 | 11/2004 |
| JP | 2008-275737 | 11/2008 |
| WO | WO 87/07848 | 12/1987 |
| WO | WO 89/00337 | 1/1989 |
| WO | 91/07519 A1 | 5/1991 |
| WO | WO 95/10117 | 4/1995 |
| WO | WO 96/23217 | 8/1996 |
| WO | WO 97/04885 | 2/1997 |
| WO | WO 97/16053 | 5/1997 |
| WO | WO 97/22631 | 6/1997 |
| WO | WO 98/10116 | 3/1998 |
| WO | WO 98/18852 | 5/1998 |
| WO | WO 99/16557 | 4/1999 |
| WO | WO 99/16931 | 4/1999 |
| WO | 99/33651 A1 | 7/1999 |
| WO | WO 99/46120 | 9/1999 |
| WO | WO 00/26973 | 5/2000 |
| WO | WO 00/35603 | 6/2000 |
| WO | WO 00/35604 | 6/2000 |
| WO | WO 00/35993 | 6/2000 |
| WO | WO 00/36661 | 6/2000 |
| WO | WO 00/36665 | 6/2000 |
| WO | WO 01/68360 | 9/2001 |
| WO | WO 01/81649 A1 | 11/2001 |
| WO | WO 01/82336 A2 | 11/2001 |
| WO | WO 01/82389 A1 | 11/2001 |
| WO | WO 01/87825 A1 | 11/2001 |
| WO | WO 01/89006 A1 | 11/2001 |
| WO | WO 02/26973 A1 | 4/2002 |
| WO | 02/051626 A1 | 7/2002 |
| WO | 02071506 A1 | 9/2002 |
| WO | WO 03/016589 A1 | 2/2003 |
| WO | WO 03/098716 A1 | 11/2003 |
| WO | WO 03/098716 A1 | 11/2003 |
| WO | WO 2004/006199 A3 | 1/2004 |
| WO | WO 2004/016992 A1 | 2/2004 |
| WO | WO 2004/070840 A1 | 8/2004 |
| WO | WO 2004/089620 A2 | 10/2004 |
| WO | 2004/112165 A1 | 12/2004 |
| WO | WO 2005/015655 A1 | 2/2005 |
| WO | WO 2005/045947 A2 | 5/2005 |
| WO | WO 2005/048368 A1 | 5/2005 |
| WO | WO 2006/036492 A1 | 4/2006 |
| WO | 2006/093898 A1 | 9/2006 |
| WO | 2008097297 A2 | 8/2008 |
| WO | 2008097297 A3 | 8/2008 |
| WO | 2008097297 A9 | 8/2008 |
| WO | 2008/144080 A1 | 11/2008 |

OTHER PUBLICATIONS

Chinese Office Action dated Mar. 18, 2010 pertains to Chinese Appln. Serial No. 200780018584.3.
U.S. Notice of Allowance dated Mar. 22, 2010 pertains to U.S. Appl. No. 11/509,837.
International Search Report/Written Opinion dated Apr. 1, 2010 pertains to U.S. International Appln. No. PCT/US09/69788.
U.S. Office Action dated Apr. 29, 2010 pertains to U.S. Appl. No. 11/068,356.
U.S. Office Action dated Mar. 18, 2010 pertains to U.S. Appl. No. 12/345,912.
European Examination Report dated Mar. 5, 2010 pertains to European Appln. No. 07 865 280.7.
Notice of Allowance dated Dec. 29, 2009 pertaining to U.S. Appl. No. 11/693,022.
International Search Report and Written Opinion pertaining to International application No. PCT/US2009/060437 dated Feb. 17, 2010.
International Search Report and Written Opinion pertaining to International application No. PCT/US2009/066518 dated Feb. 15, 2010.
Japanese Office Action pertaining to Japanese Patent Application No. 2003-586919 dated Dec. 16, 2009.
Chinese Office Action pertaining to Chinese Patent Application No. 200580049572.8 dated Jan. 8, 2010.
Notice of Allowance pertaining to U.S. Appl. No. 11/693,022 dated Jan. 28, 2010.
De Gryse, R. et al., "Sputtered Transparent Barrier Layers," Tenth International Conference on Vacuum Web Coating (Edited by R. Bakish) aka the 10$^{th}$ Bakish Conference; 1996; pp. 190-198.
Wong, C.P.; Recent Advances in IC Passivation and Encapsulation: Process Techniques and Materials; Polymers for Electronic and Photonic Applications; AT&T bell Laboratories; 1993; pp. 167-209.
Shi, M.K., et al., In-situ and real-time monitoring of plasma-induced etching PET and acrylic films, Plasma and Polymers, Dec. 1999, 4(4), pp. 1-25.

(56) References Cited

OTHER PUBLICATIONS

Affinito, J.D. et al.; Vacuum Deposited Polymer/Metal Multilayer Films for Optical Applications; Paper No. C1.13; International Conference on Metallurgical Coatings; Apr. 15-21, 1995; pp. 1-14.

Affinito, J.D. et al., "Vacuum Deposition of Polymer Electrolytes on Flexible Substrates" Proceedings of the Ninth International Conference on Vacuum Web Coating, Nov. 1995, ed R. Bakish, Bakish Press 1995, pp. 20-36.

PCT International Search Report regarding International application No. PCT/US 99/29853 dated Mar. 3, 2000.

Yializis A., et al., "Ultra High Barrier Films" 43rd Annual Technical Conference Proceedings, Denver, Apr. 15-20, 2000, pp. 404-407.

Henry, B.M. et al., "Microstructural and Gas Barrier Properties of Transparent Aluminum Oxide and Indium Tin Oxide Films" 43rd Annual Technical Conference Proceedings, Denver, Apr. 15-20, 2000, pp. 373-378.

Affmito, J.D. et al.; Vacuum Deposition of Polymer Electrolytes on Flexible Substrates; The Ninth International Conference on Vacuum Web Coating; 1995; pp. 0-16.

Norenberg, H. et al.; Comparative Study of Oxygen Permeation Through Polymers and Gas Barrier Films; 43rd Annual Technical Conference Proceedings; Denver, Apr. 15-20, 2000; pp. 347-351.

Mahon, J.K. et al.; Requirements of Flexible Substrates for Organic Light Emitting Devices in Flat Panel Display Applications; Society of Vacuum Coaters; 42nd Annual Technical Conference Proceedings; Apr. 1999; pp. 456-459.

Tropsha et al.; Activated Rate Theory Treatment of Oxygen and Water Transport through Silicon Oxide/Poly(ethylene terphthalate) Composite Barrier Structures; J. Phys. Chem B Mar. 1997; pp. 2259-2266.

Tropsha et al.; Combinatorial Barrier Effect of the Multilayer SiOx Coatings on Polymer Substrates; Society of Vacuum Coaters; 40th Annual Technical Conferences Proceedings; Apr. 12-17, 1997; pp. 64-69.

Affinito, J.D. et al.; Ultra High Rate, Wide Area, Plasma Polymerized Films from High Molecular Weight/Low Vapor Pressure Liquid or Solid Monomer Precursors; 45th International Symposium of the American Vacuum Society; Nov. 2-6, 1998; pp. 0-26.

Felts, J.T.; Transparent Barrier Coatings Update: Flexible Substrates; 36th Annual Technical Conference Proceedings; Apr. 25-30, 1993 pp. 324-331.

Affinito, J.D. et al.; Molecularly Doped Polymer Composite Films for Light Emitting Polymer Application Fabricated by the PML Process, 41st Technical Conference of the Society of Vacuum Coaters; Apr. 1998; pp. 220-225.

Affinito, J.D. et al.; Vacuum Deposited Conductive Polymer Films; The Eleventh International Conference on Vacuum Web Coating; Nov. 9-11, 1997; pp. 0-12.

Affinito, J.D. et al.; Polymer/Polymer, Polymer/Oxide, and Polymer/Metal Vacuum Deposited Interferences Filters; Tenth International Vacuum Web Coating Conference; Nov. 1996; pp. 0-14.

Kukla, R. et al.; Transparent Barrier Coatings with EB-Evaporation, an Update; Section Five; Transparent Barrier Coating Papers; Thirteenth International Conference on Vacuum Web Coatings; Oct. 17-19, 1999; pp. 222-233.

Bright, Clark I.; Transparent Barrier Coatings Based on ITO for Flexible Plastic Displays; Thirteenth International Conference on Vacuum Web Coatings; Oct. 17-19, 1999; pp. 247-255.

Henry, B.M. et al.; Microstructural Studies of Transparent Gas Barrier Coatings on Polymer Substrates; Thirteenth International Conference on Vacuum Web Coatings; Oct. 17-19, 1999; pp. 265-273.

Hibino, N. et al.; Transparent Barrier $Al_2O_3$ Coating by Activated Reactive Evaporation; Thirteenth International Conference on Vacuum Web Coatings; Oct. 17-19, 1999; pp. 234-245.

Shi, M.K. et al.; Plasma treatment of PET and acrylic coating surfaces-I. In situ XPS measurements; Journal of Adhesion Science and Technology; Mar. 2000, 14(12); pp. 1-28.

Affinito, J.D. et al.; "PML/Oxide/PML Barrier Layer Performance Differences Arising From Use of UV or Electron Beam Polymerization of the PML Layers;" SVC 40th Annual Technical Conference; Apr. 12-17, 1997; pp. 19-25.

Yializis, A. et al.; High Oxygen Barrier Polypropylene Films Using Transparent Acrylate-$A_2O_3$ and Opaque Al-Acrylate Coatings; 1995; pp. 95-102; Society of Vacuum Coaters.

Shaw, D.G. et al.; Use of Vapor Deposted Acrylate Coatings to Improve the Barrier Properties of Metallized Film; 1994; pp. 240-244; Society of Vacuum Coaters.

Affinito, J.D. et al.; "Vacuum Deposited Conductive Polymer Films" The Eleventh International Conference on Vacuum Web Coating, no earlier than Feb. 1998, pp. 200-213.

Bunshah, R.F. et al.; "Deposition Technologies for Films and Coatings" Noyes Publications, Park Ridge, New Jersey, 1982, p. 339.

Affinito, J.D.; Energy Res. Abstr. 18(6), #17171, 1993.

Atsuhisa Inoue, Maariko Ishino, Yoshiro Akagi and Yoshiharu Nakajima, Fabrication of a Thin Film of MNA by Vapour Deposition, Proc. of the 33rd Japan Conf. on Materials Research, U.33, p. 177-179, 1990.

Affinito, J.D. et al; Ultrahigh Rate, Wide Area, Plasma Polymerized Films from High Molecular Weight/Low Vapor Pressure Liquid or Solid Monomer Precursors; Journal Vacuum Science Technology A 17(4); Jul./Aug. 1999; pp. 1974-1982; American Vacuum Society.

Graupner, W. et al.; "High Resolution Color Organic Light Emitting Diode Microdisplay Fabrication Method", SPIE Proceedings; Nov. 6, 2000; pp. 11-19.

Czeremuszkin, G. et al.; Permeation Through Defects in Transparent Barrier Coated Plastic Films; 43rd Annual Technical Conference Proceedings; Apr. 15, 2000; pp. 408-413.

Vossen, J.L. et al.; Thin Film Processes; Academic Press, 1978, Part II, Chapter 11-1, Glow Discharge Sputter Deposition, pp. 12-63; Part IV, Chapter IV-1 Plasma Deposition of Inorganic Compounds and Chapter IV-2 Glow Discharge Polymerization, pp. 335-397.

G. Gustafason, et al.; Flexible light-emitting diodes made from soluble conducting polymers; Letters to Nature; Vo. 357; Jun. 11, 1992; pp. 477-479.

F.M. Penning; Electrical Discharges in Gases; 1965; pp. 1-51; Gordon and Breach, Science Publishers, New York-London-Paris.

Affinito, J.D., et al.; High Rate Vacuum Deposition of Polymer Electrolytes; Journal Vacuum Science Technology A 14(3), May/Jun. 1996.

Phillips, R.W.; Evaporated Dielectric Colorless Films on PET and OPP Exhibiting High Barriers Toward Moisture and Oxygen; Society of Vacuum Coaters; 36th Annual Technical Conference Proceedings; 1993; pp. 293-301.

Yamada Y. et al.; The Properties of a New Transparent and Colorless Barrier Film; 1995; pp. 28-31; Society of Vacuum Coaters.

Chahroudi, D.; Transparent Glass Barrier Coatings for flexible Film Packaging; 1991; pp. 130-133; Society of Vacuum Coaters.

Krug, T. et al.; New Developments in Transparent Barrier Coatings; 1993; pp. 302-305; Society Vacuum Coaters.

Affinito, J.D. et al.; A new method for fabricating transparent barrier layers, Thin Solid Films 290-291; 1996; pp. 63-67.

Affinito, J.D. et al.; Polymer-Oxide Transparent Barrier Layers; SVC 39th Annual Technical Conference; Vacuum Web Coating Session; 1996; pp. 392-397.

Hoffman, G. et al.; Transparent Barrier Coatings by Reactive Evaporation; 1994; pp. 155-160; Society of Vacuum Coaters.

Kelmberg-Sapieha, J.E. et al.; Transparent Gas Barrier Coatings Produced by Dual-Frequency PECVD; 1993; pp. 445-449; Society of Vacuum Coaters.

Finson, E. et al.; Transparent $SiO_2$ Barrier Coatings: Conversion of Production Status; 1994; pp. 139-143; Society of Vacuum Coaters.

Affinito, J.D. et al; Ultra High Rate, Wide Area, Plasma Polymerized Films from High Molecular Weight/Low Vapor Pressure Liquid or Liquid/Solid Suspension Monomer Precursors; MRS Conference; Nov. 29, 1998-Dec. 3, 1998; Paper No. Y12.1.

Chwang et al, "Thin film encapsulated flexible organic electroluminescent displays" Applied Physics Letters, vol. 83, No. 3, Jul. 21, 2003, pp. 413-415.

(56) References Cited

OTHER PUBLICATIONS

Akedo et al, "Plasma-CVD SiNx/Plasma-Polymerized CNx:H Multi-layer Passivation Films for Organic Light Emitting Diodes" Society of Information Display Digest of Technical Papers, vol. 34, No. 1, May 1, 2003, pp. 559-561.
"Universal Display Corporation'S White OLED Technology Exceeds 100 LM/W—A Major Milestone for Solid-State Lighting", Universal Display Corporation, Jun. 17, 2008, pp. 1-3.
Sun, Yiru et al., "Enhanced light out-coupling of organic light-emitting devices using embedded low-index grids", Letters, Jul. 11, 2008, pp. 1-5.
Lee, Yong-Jae et al., "A high-extraction-efficiency nanopatterned organic light-emitting diode", Applied Physics Letters, vol. 82, No. 21, May 26, 2003, pp. 1-3.
Kamaev, Vladimir et al., "Optical studies of 2D and 3D metallo-dielectric photonic crystals", Plasmonics: Metallic Nanostructures and Their Optical Properties III, Proceedings of SPIE vol. 5927, 2005, pp. 1-13.
Ishibashi, Tadashi et al., "Active Matrix Organic light Emitting Diode Display Based on "Super Top Emission" Technology", Japanese Journal of Applied Physics, vol. 45, No. 5B, 2006, pp. 4392-4395.
Dodabalapur, A. et al., "Color variation with electroluminescent organic semiconductors in multimode resonant cavities" Appl. Phys. Lett. 65 (18), Oct. 31, 1994, pp. 2308-2310.
Tanaka, Daisaku et al., "Ultra High Efficiency Green Organic Light-Emitting Devices", Japanese Journal of Applied Physics, 46 (2007), pp. L10-L12, pp. 1-3.
Lee, Jiun-Haw et al., "Radiation Simulations of Top-Emitting Organic Light-Emitting Devices With Two- and Three-Microcavity Structures", Journal of Display Technology, vol. s, No. 2, Jun. 2006, pp. 130-137.
Young-Gu Lee et al., "Thin Film Encapsulation of AMOLED Displays with Polyurea/Al2O3 Hybrid Multi-Layers", Reformable Display Group, Samsung Electronics, Paper, pp. 1457-1459 (IDW 2008).
Office Action dated Aug. 12, 2010 pertains to U.S. Appl. No. 12/758,244.
Advisory Action of U.S. Appl. No. 10/412,133 dated Apr. 8, 2008.
Advisory Action of U.S. Appl. No. 10/412,133 dated Aug. 8, 2008.
Advisory Action of U.S. Appl. No. 11/112,880 dated Jul. 23, 2009.
Advisory Action of U.S. Appl. No. 11/693,022 dated Oct. 21, 2009.
Election/Restrictions Requirement of U.S. Appl. No. 10/412,133 dated Dec. 28, 2004.
Election/Restrictions Requirement of U.S. Appl. No. 11/112,880 dated Jul. 25, 2008.
Election/Restrictions Requirement of U.S. Appl. No. 11/693,020 dated Aug. 8, 2008.
Election/Restrictions Requirement of U.S. Appl. No. 11/693,022 dated Oct. 7, 2008.
Advisory Action of U.S. Appl. No. 11/068,356 dated Feb. 12, 2008.
Election/Restrictions Requirement of U.S. Appl. No. 11/693,020 dated Jun. 25, 2009.
Election/Restrictions Requirement of U.S. Appl. No. 11/509,837 dated Mar. 4, 2009.
Notice of Allowance of U.S. Appl. No. 11/776,616 dated Sep. 18, 2009.
Office Action of U.S. Appl. No. 11/693,022 dated Jan. 23, 2009.
Office Action of U.S. Appl. No. 10/412,133 dated Mar. 3, 2006.
Office Action of U.S. Appl. No. 10/412,133 dated Mar. 28, 2005.
Office Action of U.S. Appl. No. 11/112,880 dated May 28, 2009.
Advisory Action of U.S. Appl. No. 11/068,356 dated Mar. 30, 2009.
Office Action of U.S. Appl. No. 11/693,022 dated Aug. 18, 2009.
Office Action of U.S. Appl. No. 10/412,133 dated Sep. 5, 2007.
Office Action of U.S. Appl. No. 10/412,133 dated Sep. 7, 2006.
Office Action of U.S. Appl. No. 11/776,616 dated Sep. 26, 2008.
Office Action of U.S. Appl. No. 10/412,133 dated Nov. 3, 2005.
Office Action of U.S. Appl. No. 11/112,880 dated Dec. 3, 2008.
Office Action of U.S. Appl. No. 10/412,133 dated Dec. 11, 2007.
Office Action of U.S. Appl. No. 11/693,020 dated Dec. 30, 2008.
Election/Restrictions Requirement of U.S. Appl. No. 11/068,356 dated Oct. 17, 2008.
Office Action of U.S. Appl. No. 11/068,356 dated Jan. 22, 2009.
Office Action of U.S. Appl. No. 11/068,356 dated Apr. 4, 2008.
Office Action of U.S. Appl. No. 11/068,356 dated Jun. 10, 2009.
Office Action of U.S. Appl. No. 11/068,356 dated Jun. 15, 2007.
Office Action of U.S. Appl. No. 11/068,356 dated Nov. 28, 2007.
Office Action of U.S. Appl. No. 11/509,837 dated Jun. 30, 2009.
Election/Restrictions Requirement of U.S. Appl. No. 12/345,912 dated Oct. 27, 2009.
Office Action of U.S. Appl. No. 11/693,020 dated Oct. 29, 2009.
Advisory Action dated Dec. 15, 2009 pertaining to U.S. Appl. No. 11/693,020.
Election/Restrictions Requirement dated Dec. 14, 2009 pertaining to U.S. Appl. No. 11/509,837.
Examiner's Answer dated Nov. 12, 2009 pertaining to U.S. Appl. No. 10/412,133.
Office Action dated Dec. 7, 2009 pertaining to U.S. Appl. No. 11/068,356.
Office Action dated Dec. 1, 2009 pertaining to U.S. Appl. No. 11/627,583.
Office Action pertaining to U.S. Appl. No. 12/341,251 dated Feb. 17, 2011.

\* cited by examiner

ENCAPSULATED RGB OLEDS HAVING ENHANCED OPTICAL OUTPUT

The invention relates generally to encapsulated organic light emitting devices (OLEDs), and more particularly to encapsulated red, green, and blue (RGB) OLEDs having improved light outcoupling compared to the bare RGB OLED.

BACKGROUND OF THE INVENTION

The optimization of the light outcoupling from an OLED is an important factor in the commercialization of OLEDs in many applications.

OLEDs have reached remarkable levels of power efficiencies over the years by lowering the operating voltage and increasing the quantum yield of internal light generation to almost 100% resulting in power efficiencies of more than 120 Lm/Watt for green light (Ultra High Efficiency Green Organic Light-Emitting Devices, Jpn. J. Appl. Phys. 46, p. L10-L12, (2007))|and recently 100 Lm/W for white light (Press Release of Jun. 17, 2008 by Universal Display Corp.).

In this application, we will discuss OLED displays and OLED light sources which are made of pixels or stripes which can emit the primary colors R, G, and B. For a display, by varying the intensity of each of these components, all of the colors of the visible spectrum can be generated. In the case of white light sources, the intensity of the R, G and B pixels can be varied to get the optimal white light to address the lighting requirements for a particular lighting application. By increasing the red component, the white light can be made 'warmer,' and by increasing the blue component, the white light will appear to be 'colder'.

The high efficiency is a major advantage not only for the use of OLEDs for displays, but also their use as a light source for signage and general lighting purposes.

Nevertheless, the efficiency could be much higher if all the light which is generated within the OLED device were actually being coupled out of the device. Currently, this efficiency is only about 20-25%, due to the planar waveguiding properties of the OLED device.

Efforts have been made to enhance this light out-coupling by putting optical stacks and/or scattering layers on top of the device. However, these methods do not necessarily result in optimized light output.

A multilayer mirror formed by a quarter-wave stack only enhances one narrow band of wavelengths of light emitted from the OLED. The structure in a quarter wave stack is wavelength dependent, which means that the use of the same structure for RGB applications can be problematic. Also, the number of layers needed for an effective quarter wave (QW) stack can be quite high (e.g., 10 layers pairs), which makes it impractical for many commercial applications. Furthermore, the OLED emission is generally broad. In a well designed QW stack, it is possible that a portion of the light will not be transmitted. Another disadvantage of the structure is that the intensity of the light transmitted by a QW stack is strongly directional, and in general the stack is designed with maximum intensity for forward transmission. This feature is generally unfavorable for display applications because it limits the viewing angle and is unacceptable for general applications in solid state lighting (SSL). The implementation of effective QW stacks requires strict control of thickness uniformity ($\Delta t<5$ nm). This is generally achieved with a thin layer (t<20 nm) deposited at relatively low speed. It would become impractical for thick layers (100 nm<t<1000 nm), as for example, the layers required to form an efficient environmental barrier.

Optical cavities (single and multiple) have been suggested to enhance the light output of OLED devices. Similarly to QW stacks, optical cavities are wavelength specific. Therefore, a specific design and its accurate implementation are necessary for each wavelength. The emission from a single optical cavity is very angular dependent. Double or triple cavities must be implemented to make the emission independent from the observation point. The implementation is therefore practically difficult and complex and may require a different sequence of layers as well as different thicknesses of the layers in parts of the device.

Another problem with using OLEDs in flat panel displays and other information display formats is that they are limited by the poor environmental stability of the devices. G. Gustafson, Y. Cao, G. M. Treacy, F. Klavetter, N. Colaneri, and A. J. Heeger, Nature, Vol. 35, 11 Jun. 1992, pages 477-479. Humidity and oxygen significantly reduce the useful life of most OLEDs. As a result, these devices are typically fabricated on glass substrates with glass covers laminated on top of the OLED and with the edges sealed to exclude water and oxygen from the active layers.

Thus, there remains a need for a method of improving the light outcoupling of encapsulated OLEDs compared to the bare OLED, while protecting the OLED from environmental contaminants.

DESCRIPTION OF THE INVENTION

Figure 1A:
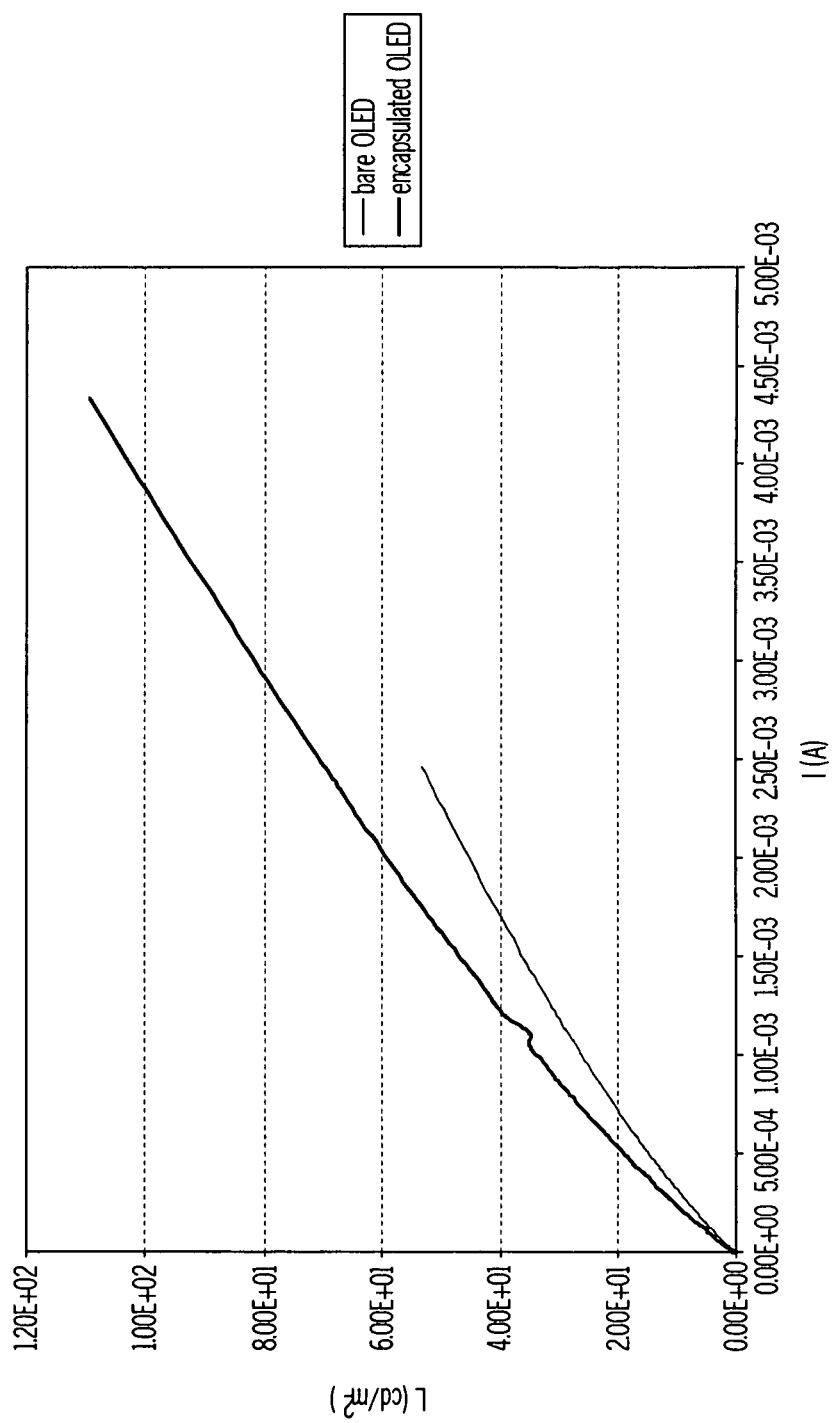
FIG. 1A and 1B are graphs showing the effect of encapsulation on I-L curves for an OLED.

The present invention meets that need by providing a method of making an integrated barrier and optical enhancement stack for protecting and improving the light out coupling of an encapsulated OLED. The method includes providing an OLED having at least two colors selected from red, green, or blue and a transparent electrode; selecting an initial inorganic barrier layer having a refractive index in a range of about 1.55 to about 2, the initial inorganic barrier layer adjacent to the transparent electrode in the OLED; optimizing a thickness of the initial inorganic barrier layer for the OLED, the thickness being in a range of about 40 nm to about 240 nm; selecting a barrier stack comprising an inorganic barrier layer and a polymeric decoupling layer, the inorganic barrier layer having a refractive index in a range of about 1.55 to about 2, and the polymeric decoupling layer having a refractive index in a range of about 1.4 to about 1.65, the barrier stack adjacent to the initial inorganic barrier layer; and optimizing a thickness of the inorganic barrier layer and the polymeric decoupling layer of the barrier stack, the thickness of the inorganic barrier layer being in a range of about 20 nm to about 80 nm, and the thickness of the polymeric decoupling layer being in a range of about 0.2 μm to about 4 μm; wherein the thickness of at least one of the initial inorganic barrier layer, the inorganic barrier layer, or the polymeric decoupling layer are optimized for at least one of maximum efficiency, minimum dispersion, or minimum spectral shift so that the encapsulated OLED has enhanced light outcoupling compared to a bare OLED; depositing the initial inorganic barrier layer having the optimized thickness adjacent to the transparent electrode of the OLED; and depositing the barrier stack having the optimized thickness for the inorganic barrier layer and the polymeric decoupling layer adjacent to the initial inorganic layer.

OLED is a generic term for a light emitting device based on organic materials. Suitable organic materials cover a wide range of materials, including polymers, small molecules, or oligomers. Depending on the organic emissive layer being used, the emission of the OLED can vary in color. By 'OLED,' we mean the entire emitting structure which can include one, two, three, or more organic materials which generate different colors. The emissive layers of the OLED can contain a thin layer of inorganic quantum dots in a device made with organic layers, or a layer of such quantum dots embedded in an organic layer.

By 'adjacent,' we mean next to, but not necessarily directly next to. There can be additional layers intervening between the adjacent layers. In the event that additional layers are used between the adjacent layers, those layers should be optimized as part of the structure using the optical simulation as well.

The decoupling layer decouples defects between adjacent layers and/or the substrate. The processes used to deposit the barrier layers tend to reproduce any defects in the layer they are deposited on. Therefore, defects in or on the substrate or previous layer may be replicated in the deposited barrier layer, which can seriously limit the barrier performance of the films. The decoupling layer interrupts the propagation of defects from one layer to the next. This is achieved by reducing the surface imperfections of the substrate or previous layer, so that the subsequently deposited barrier layer or other layer, such as the organic light emitting device, has fewer defects. Thus, the decoupling layer has improved surface planarity compared to the previous layer. In addition, the decoupling layers decouple defects in the barrier layers. The decoupling layer intervenes between barrier layers so that the defects in one layer are not next to the defects in the subsequent layer. This creates a tortuous path for gas diffusion, helping to improve the barrier properties. A decoupling layer which is deposited over the barrier layer may also help to protect the barrier layer from damage during processing or further handling.

The decoupling layers can be deposited using a vacuum process, such as flash evaporation with in situ polymerization under vacuum, or plasma deposition and polymerization, or atmospheric processes, such as spin coating, ink jet printing, screen printing, or spraying. The decoupling layer can be made of any suitable decoupling material, including, but not limited to, organic polymers, inorganic polymers, organometallic polymers, hybrid organic/inorganic polymer systems, and combinations thereof. Organic polymers include, but are not limited to, urethanes, polyamides, polyimides, polybutylenes, isobutylene isoprene, polyolefins, epoxies, parylenes, benzocyclobutadiene, polynorbornenes, polyarylethers, polycarbonates, alkyds, polyaniline, ethylene vinyl acetate, ethylene acrylic acid, and combinations thereof. Inorganic polymers include, but are not limited to, silicones, polyphosphazenes, polysilazanes, polycarbosilanes, polycarboranes, carborane siloxanes, polysilanes, phosphonitriles, sulfur nitride polymers, siloxanes, and combinations thereof. Organometallic polymers include, but are not limited to, organometallic polymers of main group metals, transition metals, and lanthanide/actinide metals, or combinations thereof. Hybrid organic/inorganic polymer systems include, but are not limited to, organically modified silicates, preceramic polymers, polyimide-silica hybrids, (meth)acrylate-silica hybrids, polydimethylsiloxane-silica hybrids, and combinations thereof.

The barrier layers can be deposited using a vacuum process, such as sputtering, chemical vapor deposition (CVD), metalorganic chemical vapor deposition (MOCVD), plasma enhanced chemical vapor deposition (PECVD), evaporation, sublimation, electron cyclotron resonance-plasma enhanced vapor deposition (ECR-PECVD), and combinations thereof. The barrier layers can be made of any suitable barrier material. Suitable inorganic materials based on metals include, but are not limited to, individual metals, two or more metals as mixtures, inter-metallics or alloys, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxyborides, metal and mixed metal silicides, or combinations thereof. Metals include, but are not limited to, transition ("d" block) metals, lanthanide ("f" block) metals, aluminum, indium, germanium, tin, antimony and bismuth, and combinations thereof. Many of the resultant metal based materials will be conductors or semiconductors. The fluorides and oxides will include dielectrics (insulators), semiconductors and metallic conductors. Non-limiting examples of conductive oxides include aluminum doped zinc oxide, indium tin oxide (ITO), antimony tin oxide, titanium oxides ($TiO_x$ where $0.8 \leq x \leq 1$) and tungsten oxides ($WO_x$ where $2.7 \leq x \leq 3.0$). Suitable inorganic materials based on p block semiconductors and non-metals include, but are not limited to, silicon, silicon compounds, boron, boron compounds, carbon compounds including amorphous carbon and diamond-like carbon, and combinations of. Silicon compounds include, but are not limited to silicon oxides ($SiO_x$ where $1 \leq x \leq 2$), polysilicic acids, alkali and alkaline earth silicates, aluminosilicates ($Al_xSiO_y$), silicon nitrides ($SN_xH_y$ where $0 \leq y < 1$), silicon oxynitrides ($SiN_xO_yH_z$ where $0 \leq z \leq 1$), silicon carbides ($SiC_xH_y$ where $0 \leq y < 1$), and silicon aluminum oxynitrides (SIALONs). Boron compounds include, but are not limited to, boron carbides, boron nitrides, boron oxynitrides, boron carbonitrides, and combinations thereof with silicon.

Suitable decoupling layers and barrier layers and methods of making them are described in U.S. Pat. No. 6,268,695, entitled "Environmental Barrier Material For Organic Light Emitting Device And Method Of Making," issued Jul. 31, 2001; U.S. Pat. No. 6,522,067, entitled "Environmental Barrier Material For Organic Light Emitting Device And Method Of Making," issued Feb. 18, 2003; U.S. Pat. No. 6,570,325, entitled "Environmental Barrier Material For Organic Light Emitting Device And Method Of Making", issued May 27, 2003; U.S. Pat. No. 6,866,901, entitled Method for Edge Sealing Barrier Films, issued Mar. 15, 2005; U.S. Pat. No. 7,198,832, entitled Method for Edge Sealing Barrier Films, issued Apr. 3, 2007; application Ser. No. 11/068,356, entitled Method for Edge Sealing Barrier Films, filed Feb. 28, 2005; application Ser. No. 11/693,020, entitled Method for Edge Sealing Barrier Films, filed Mar. 29, 2007; and application Ser. No. 11/693,022, entitled Method for Edge Sealing Barrier Films, filed Mar. 29, 2007; application Ser. No. 11/776,616, entitled "Multilayer Barrier Stacks and Methods of Making Multilayer Barrier Stacks," filed Jul. 12, 2007; each of which is incorporated herein by reference.

A plasma protective layer (PPL) is a layer which shields the underlying device from exposure to a plasma which might be used to deposit barrier layers, decoupling layers, or both. Suitable plasma protective layers and methods of making them are described in pending application Ser. No. 11/439,474, filed May 23, 2006, entitled "Method of Making an Encapsulated Plasma Sensitive Device," which is incorporated herein by reference.

We propose a simple and cost effective solution for two of the most difficult problems for the OLED device: protection of the device from degradation by moisture and oxygen from the environment and enhancing the optical out-coupling and efficiency. We do this by creating a multilayer barrier structure for encapsulation with a choice of materials and structure for the multilayer barrier structure which yields enhanced optical out-coupling.

An integrated barrier and optical enhancement stack would simplify the full color display device and reduce manufacturing costs. The problem is far from trivial because the demands on both materials and structure for creating a good barrier are very stringent. In addition, creating an optical enhancement layer also poses very stringent conditions on both the choice of materials and the layer structure. While most classical optical multilayer structures to enhance the light out-coupling of a device work by creating a stack which constitutes an optical cavity, (a ¼ wavelength is a special example) which resonates and enhances one wavelength only while suppressing all other wavelengths of emitted light, the solution proposed here enhances the light in a very broad spectral range while not affecting the light for wavelengths which are not being enhanced (for instance, enhancing blue and red while leaving the green intensity the same). The advantage is obvious: instead of creating a different optical enhancement layer for each different color (at least R, G and B) which for a high resolution display would be a very costly and cumbersome exercise, we have found design rules for creating a multilayer stack which meets all of the requirements.

Design rules are disclosed for the creation of an integrated multilayer stack which provides protection for the device from the environment, and enhances the light out-coupling of the OLED full color display enhancing the efficiency for at least two wavelength ranges and keeping the efficiency of the third wavelength range unaffected. The OLED includes at least two different organic emitting materials, which can produce red, green, or blue light. If there are only two colors, then the efficiency is enhanced for those two.

We have demonstrated that it is possible to design a barrier structure for an encapsulated RGB OLED with enhanced light out coupling compared to the bare RGB OLED. By enhanced light output coupling compared to the bare RGB OLED, we mean enhancing one or more of the qualities of light in terms of maximum efficiency, minimum dispersion, or minimum spectral shift.

By maximum efficiency, we mean the maximum efficiency in a certain wavelength range. Enhancing maximum efficiency means enhancing the maximum efficiency for one or more wavelength ranges while keeping the efficiency of the other wavelength range(s) unaffected. The wavelength range for red is between about 620 to about 780 nm, for green from about 492 to about 577 nm, and for blue from about 455 to about 492 nm. However, as is well known in the art, the luminescence spectra of the emitting material used in the OLED may extend outside of the specified ranges. Desirably, the efficiency of all three wavelength ranges can be enhanced.

By enhancing maximum efficiency, we mean that the maximum efficiency is increased at least about 10% compared to the bare OLED. Desirably, the maximum efficiency is increased at least about 15%, or at least about 20% or at least about 25%, or at least about 30%, or at least about 35%, or at least about 40%, or at least about 45, or at least about 50%, or at least about 55% compared to the bare OLED.

By unaffected, we mean that the efficiency is increased less than 10% and decreased no more than about 10%, desirably no more than about 5%, compared to the efficiency of the bare unencapsulated OLED. For example, the efficiency of the red wavelength range might be increased 15%, the green wavelength range increased 25%, and the blue wavelength range decreased 5%.

By minimum dispersion, we mean that the width at half height of the distribution of emitted wavelengths is reduced for the encapsulated OLED compared to the unencapsulated OLED.

By minimum spectral shift, we mean that the position of the maximum of the emitted light distribution does not shift more than 20 nm compared to the unencapulated OLED.

An intentional spectral shift can be introduced, if desired. By intentional spectral shift, we mean that the wavelength having the maximum intensity of the emitted light for the emitting layer is shifted towards a designated wavelength range. In intentional spectral shift, the maximum wavelength for the emitting layer having the maximum intensity is shifted at least 30 nm in the encapsulated OLED compared to the spectral distribution of the light emitting material. This is done to increase the total color gamut of the display. The intentional shift can be at least about 40 nm, or at least about 50 nm, or at least about 60 nm, or at least about 70 nm, or at least about 80 nm, or at least about 90 nm, or at least about 100 nm, or more. If an intentional spectral shift is introduced, the maximum intensity may decrease.

In some instances, this method can be used to fine tune the spectral purity and the wavelength range of the OLED to obtain more favorable emission characteristics for a certain type of application. An example of this would be obtaining a specific color where the luminscence spectra of the emitting material used in making the OLED was broader than desired.

Optionally, the cathode can be included in the optimization process. The cathode can be made of conductive oxides, desirably transparent conductive oxides, metallic layers, or nanotubes (RI of about 1.6) (typically, carbon nanotubes). The cathode can be a single layer or a multilayer structure. For example, it could be a single layer of a conductive oxide such as indium tin oxide or a metal such as Ag. Alternatively, it could be a multilayer structure including one or more layers of conductive oxide, metallic layers, or combinations thereof. In the case of a multilayer structure, the RI of each of the layers would be used. The cathode layers typically have an RI in the range of about 1.6 to about 2, desirably about 1.8 to about 2. The total thickness of the cathode is typically in the range of about 20 to about 300 nm.

The encapsulated RGB OLEDs can optionally include a PPL. The PPL can be organic or inorganic. An inorganic PPL will generally have a thickness, t, 20 nm<t<50 nm and refractive index (RI) 1.1<n<1.9. An organic PPL will generally have a thickness, t, 20 nm<t<50 nm and refractive index (RI) 1.1<n<1.9. The PPL is desirably inorganic. For a given RI of the PPL, the specific thickness may be chosen optimizing the propagation of the visible electromagnetic waves emitted by the specific OLED (light emitting compound and structure) to achieve maximum efficiency (or other property as described above). For example, see FIGS. 3A-3B.

The encapsulated RGB OLEDs include an initial inorganic barrier layer with thickness, $t_o$, 40 nm<$t_o$<240 nm, and RI, $n_o$, 1.55<$n_o$<2. For a given RI of the initial inorganic barrier layer, the specific thickness may be chosen optimizing the propagation of the visible electromagnetic waves emitted by the specific OLED (light emitting compound and structure) to achieve maximum efficiency (or other property as described above). See FIGS. 5A-5C.

The encapsulated RGB OLEDs include one or more barrier stacks comprising one or more inorganic barrier layers decoupled by one or more polymeric decoupling layers. The barrier layers typically have a refractive index $n_b$~$n_o$ and a thickness, $t_b$, 20 nm<$t_b$<80 nm. The polymeric decoupling layers typically have a refractive index $n_p$, 1.4<$n_p$<1.5, and a thickness $t_p$, 0.2 Mm<$t_o$<4 μm. The specific thickness of the layers may be chosen optimizing for maximum efficiency (or minimum dispersion) the propagation of the visible electromagnetic waves emitted by the specific OLED (light emitting compound and structure), and the previously coated barrier structure, while the number of stacks is defined by the barrier specifications required by the considered application. See FIGS. 7-8.

Using the method of the present invention, it is possible to find multiple satisfactory compromises of the solution listed above such that a RGB display can be created with enhanced light output.

The simulations of the RGB OLEDs/multilayer integral barrier and optical enhancement stacks were computed using a computer program developed for Vitex Systems Inc. by the Professor Jiun-Haw Lee research group at Graduate Institute of Electro-Optical Engineering, Graduate Institute of Communication Engineering, and Department of Electrical Engineering, National Taiwan University, Taipei 10617, Taiwan, R.O.C. The main assumptions of the model, the mathematics used, and some results on optimization of top emitting (TE) OLED device are described in "Radiation Simulations of Top-Emitting Organic Light Emitting Devices With Two- Or Three-Microcavity Structures," Journal Of Display Technology, Vol. 2, No. 2, June 2006 p. 130, which is incorporated herein by reference.

The model has been extended to include the barrier layers in the calculations.

The model assumes that the recombination excitons producing the light emitted by the top emitting OLED devices can be represented by a distribution of randomly oriented dipoles located in the emission layer (EL). The emission pattern of the OLED is therefore simulated by simulating the emission pattern of the dipole distribution considering the propagation through the layers of the OLED and the encapsulation.

In the theoretical formulation, the model finds the exact classical solution to the problem of the propagation of the electromagnetic field in the multilayer structure by using the Hertzian vector representation of the inhomogenous vector wave equation.

$\vec{\Pi} = \hat{x}\Pi_x + \hat{z}\Pi_z$ is the electric Hertzian vector due to a vertical or horizontal dipole in the emission layer. If $e^{j\omega t}$ describes the time dependence of the electromagnetic field generated by the dipole, the electric field $\vec{E}$ and the magnetic field $\vec{H}$ can be evaluated through the following equations:

$$\vec{E} = \nabla(\nabla \cdot \vec{\Pi}) + k_0^2 n^2 \vec{\Pi}$$

$$\vec{H} = j\omega\epsilon_0 n^2 \nabla \times \vec{\Pi}$$

where $k_0 = \omega\sqrt{\mu_0\epsilon_0} = 2\pi/\lambda$, wavenumber in vacuum.
and n (or $n_i$ in the ith layer) is the wavelength-dependent complex refractive index. The solution for the electrical Hertzian potential $\Pi$ can be found solving the following equations:

$$(\nabla^2 + k_0^2 n_e^2)\vec{\prod}(\vec{r}) = -\frac{\vec{p}\delta(\vec{r})}{\epsilon_0 n_e^2} \text{ in emission layer}$$

$$(\nabla^2 + k_0^2 n_i^2)\vec{\prod}(\vec{r}) = 0 \text{ in } i^{th} \text{ layer (non-emission layer)}$$

In this $\vec{p}$ represents a dipole source located at $\vec{r}$, $n_e$ and $n_i$ are the complex refractive index, respectively, of the emission layer and of the other layer in the OLED or encapsulation.

To solve the equations, the cylindrical symmetry properties of the system can be used and the integral expression of the Hertzian vector can be found using the Fourier-Bessel transform in each each layer.

$$\tilde{\Pi}(\alpha,z) = \int_0^\infty \Pi(\rho,z) J_0(\alpha\rho)\rho \, d\rho$$

The unknown coefficients of the expansion can be found considering the boundary conditions that the electric and magnetic fields must be continuous at the interface between layers. By using the calculated coefficients, the integral components of the electromagnetic field can be calculated. Far from the source (i.e., in the far-field) the integration can be done using the saddle method to integrate in the radial direction.

For an emitting layer composed of a large number of randomly oriented dipoles, we can decompose the field in vertical and horizontal dipole components. The total radiation intensity will be therefore given by the addition of the sum of the two horizontal and vertical components.

The emission spectrum and intensity of the emitted light is then calculated considering the transmission and reflection at each layer of the OLED device and of the barrier layer.

In the following simulations, the number of dipoles used as a source has been kept constant so that the comparison between absolute intensity represents a variation given by the OLED or barrier structure.

In addition, for all of the simulations unless otherwise stated, a simple TE OLED structure based on Alq3 (tris(8-hydroxyquinolinato)aluminum) was used:

Ag Anode/HT (RI=1.766, 50 nm)/EL+ET (Alq3, 50 nm)/cathode where HT is the hole transmission layer, EL is the emission layer, and ET is the electron transport layer.

The following examples show simulations using the model described above (Examples 2, and 4-10) and experimental data supporting the model (Examples 1 and 3).

Example 1

Figure 14:
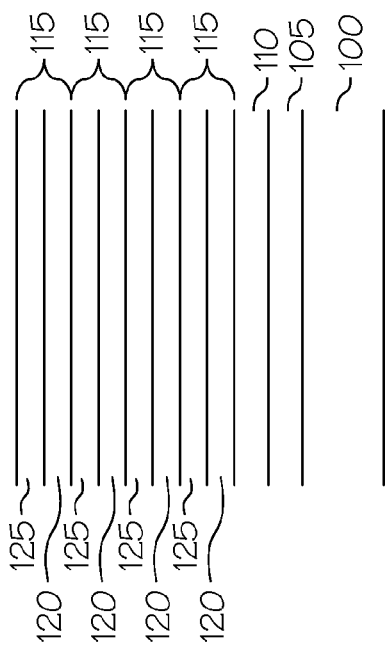
FIG. 14 is an illustration of one embodiment of an encapsulated OLED.

FIG. 1A compares the experimentally observed light emission of a bare OLED and of the same OLED after coating with an integrated barrier and optical enhancement stack. As shown in FIG. 14, the integrated barrier and optical enhancement stack on the OLED 100 included a 50 nm LiF plasma protective layer (RI-1.395) 105, a 100 nm aluminum oxide barrier layer (RI-1.65) 110, and 4 barrier stacks 115 of 0.5 µm acrylate polymer (RI-1.5) 120 and 35 nm aluminum oxide (RI-1.65) 125. The graph shows the experimental I-L curves for the OLEDs. The I-L curve for an OLED is obtained by measuring the light emitted by the OLED device as a function of the current used for driving the device itself. The light was measured in the forward direction. FIG. 1A shows an enhancement of 25% for the encapsulated OLED.

Figure 1B:
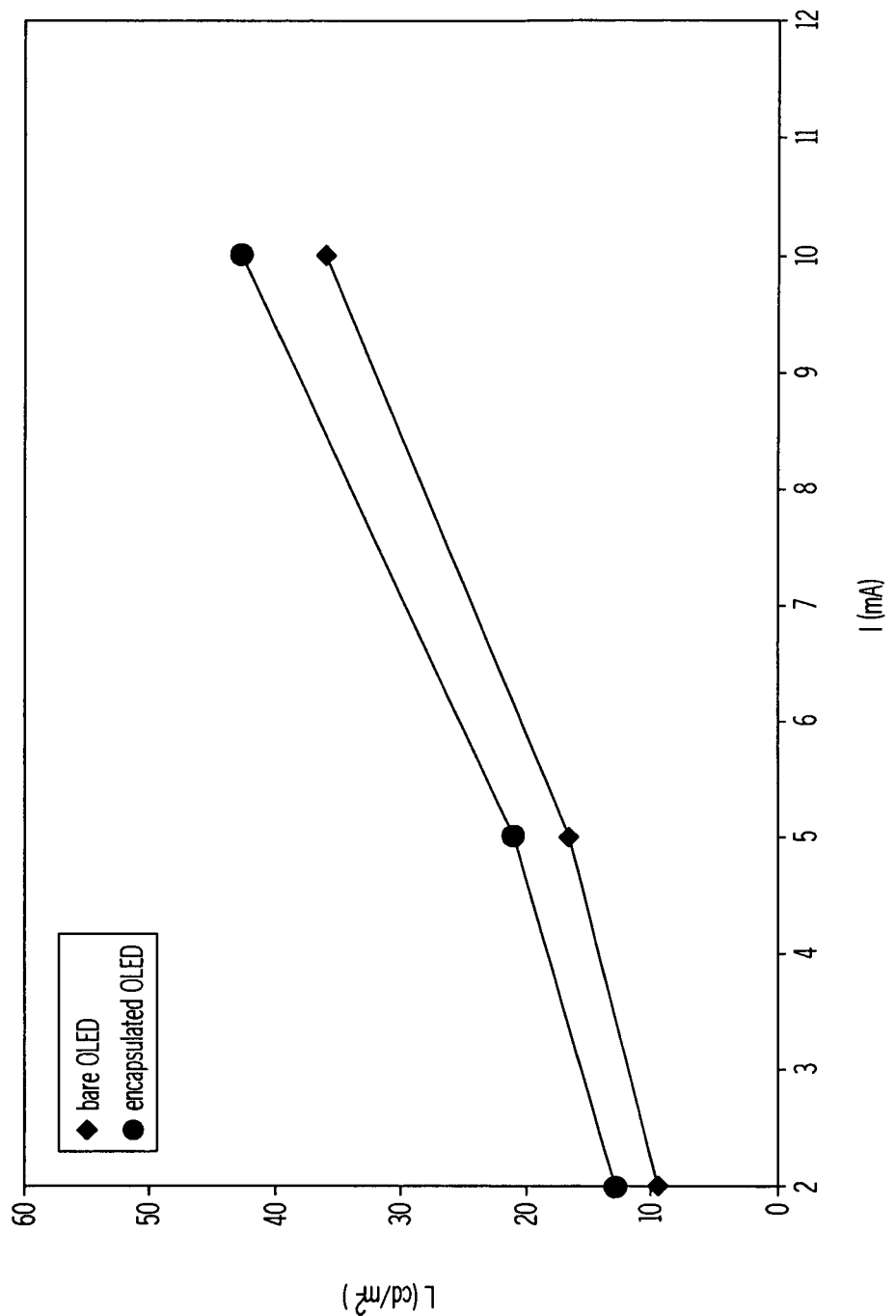

FIG. 1B compares the experimentally observed light emission of a second bare OLED and the same OLED after encapsulation. The integrated barrier and optical enhancement stack included a 50 nm LiF plasma protective layer (RI-1.395), a 100 nm aluminum oxide barrier layer (RI-1.65), and 4 barrier stacks of 0.5 µm acrylate polymer (RI-1.5) and 35 nm aluminum oxide (RI-1.65). FIG. 1B shows the experimental I-L curves. There is an enhancement of 15% for the encapsulated OLED compared to the bare OLED.

Figure 1C:
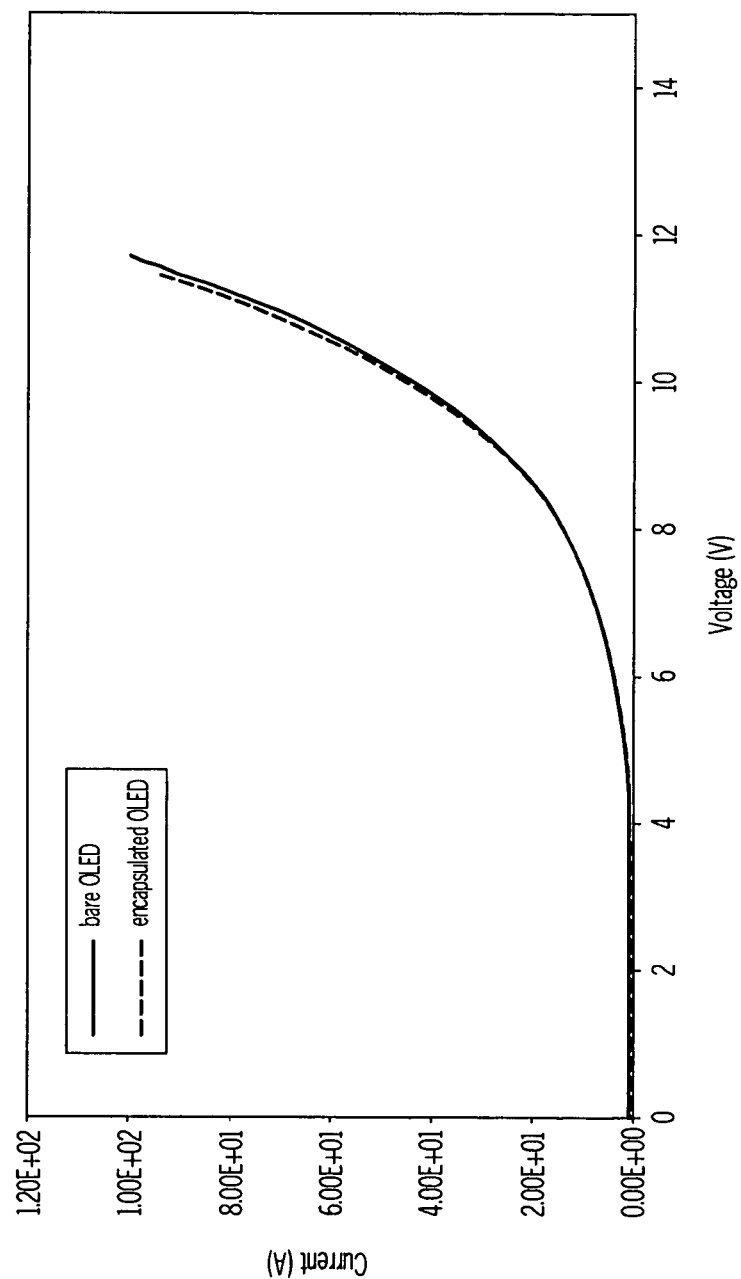
FIG. 1C is a graph showing the effect of encapsulation on the I-V curves for an OLED.

FIG. 1C shows the corresponding I-V curves for the bare OLED and encapsulated OLED of FIG. 2B. An I-V curve for an OLED is obtained by measuring the current going through the OLED while scanning the applied voltage. The I-V curve of the OLED before and after encapsulation overlap showing that the electrical performance of the OLED after encapsulation was not changed.

Example 2

Figure 2:
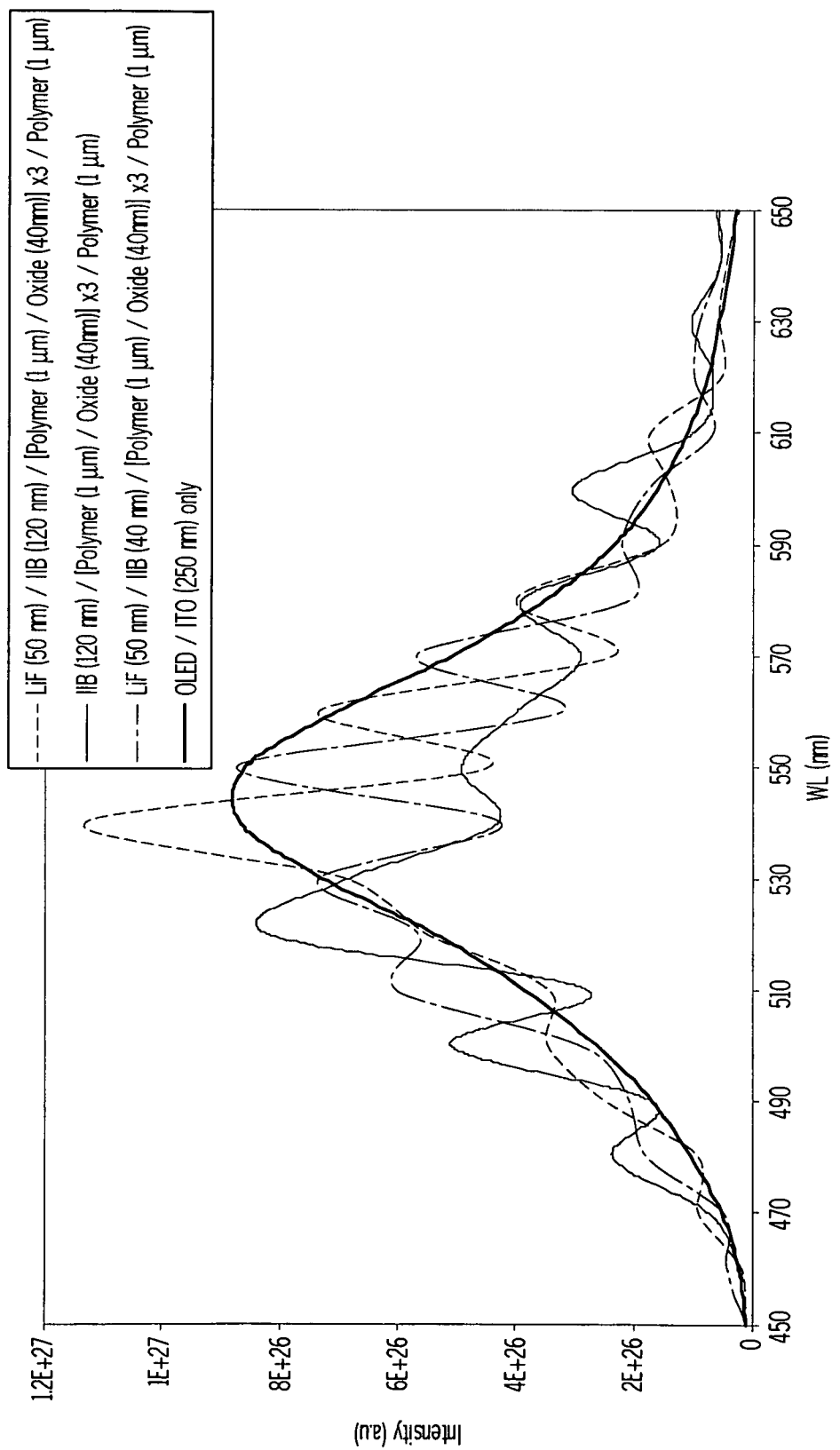
FIG. 2 is a graph showing the effect of the protective layer and initial inorganic barrier layers on intensity and spectral distribution of the emitted light for an encapsulated OLED with an ITO cathode layer.
Figure 15:
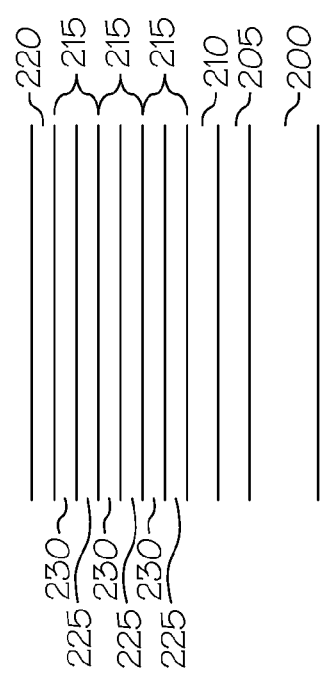
FIG. 15 is an illustration of another embodiment of an encapsulated OLED.
Figure 16:
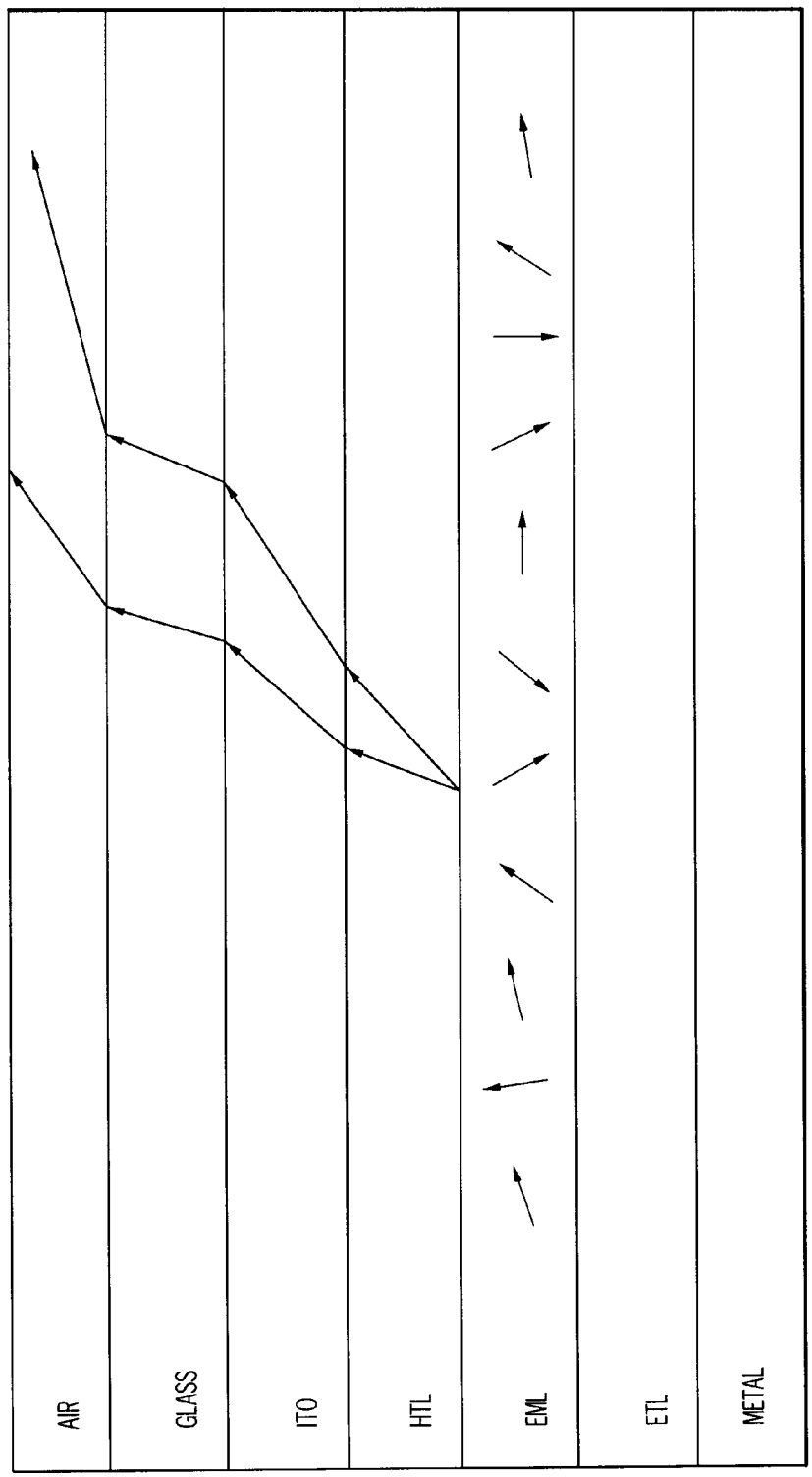
FIG. 16 shows randomly oriented dipoles located in an emission layer of an encapsulated OLED.

The effect of inorganic plasma protective layers and inorganic barrier layers between the OLED and the barrier stack were evaluated using the simulation. The OLED has a 250 nm thick ITO cathode. As shown in FIG. 15, three barrier stacks 215 are included, each having a 1 µm polymeric decoupling layer 225 and a 40 nm inorganic oxide barrier layer 230 with a 1 µm polymeric decoupling layer 220 on top of the barrier stacks 215. In FIG. 2, the light output of a bare OLED with a 250 nm ITO cathode was compared with encapsulated OLEDs having an inorganic plasma protective layer 205 and different thicknesses of initial inorganic barrier layers 210 (50 nm LiF/120 nm aluminum oxide; 120 nm aluminum oxide; 50 nm LiF/40 nm aluminum oxide) on the OLED 200. The encapsulated OLED with the LiF inorganic plasma protective layer and 120 nm initial inorganic oxide barrier layer provided improved light output. The optimization was in terms of peak intensity, color purity, and color coordinates. The model shows that the introduction of the plasma protective layer can lead to a 20% increase in peak intensity. With a fixed electrical power input, the increase in intensity of the emitted light shows that the efficiency of the light generation has increased.

Example 3

Example 3 shows experimental results of the effect of introducing a plasma protective layer.

Figure 3A:
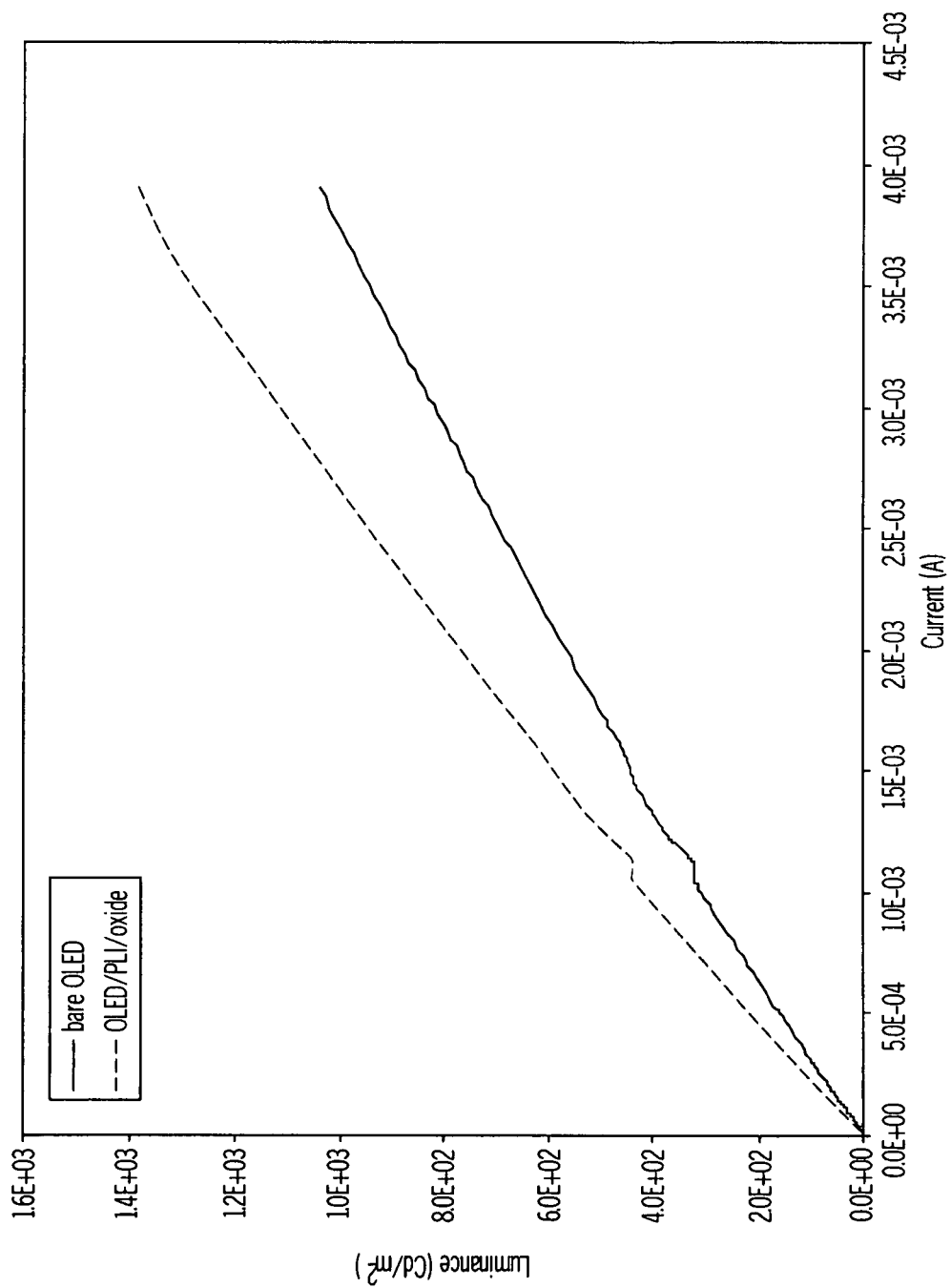
FIG. 3A-3B are graphs showing the effect of different protective layers having the same thickness.
Figure 3B:
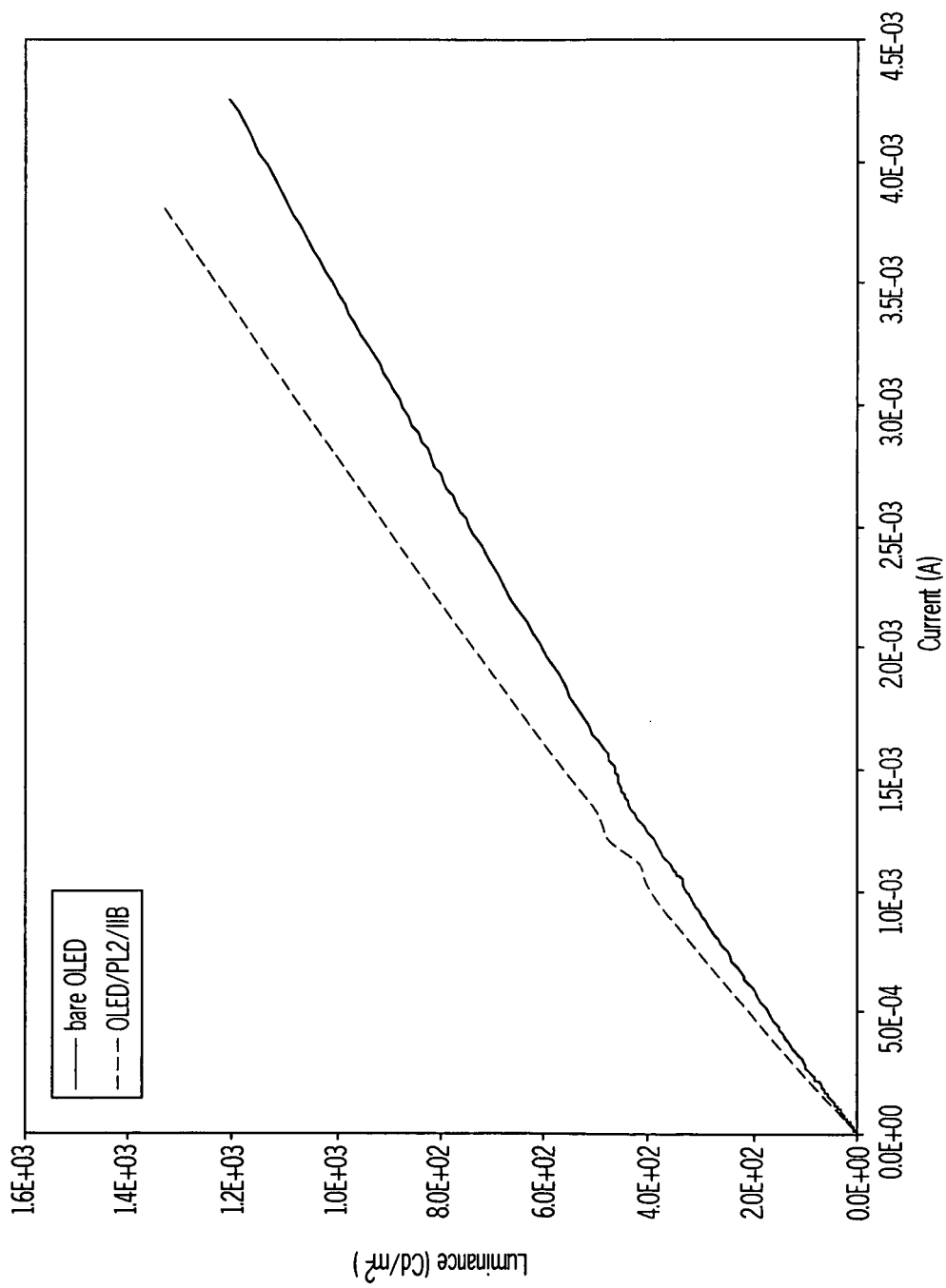

FIG. 3 compares the effect of different protective layers having the same thickness. The graphs report experimental I-L curves. The emitted light was measured in the forward direction. The two OLEDs had the identical structure and had been deposited on the same motherglass (in the same run). The two protective layers, PL1 and PL2, had the same thickness, 50 nm. The RI of PL1 was 1.4, and the RI of PL2 was 1.8. FIG. 3A shows an enhancement of 35% for the PPL with an RI of 1.4, while FIG. 3B shows an enhancement of 14% for a PPL with the RI of 1.8.

Example 4

Figure 4:
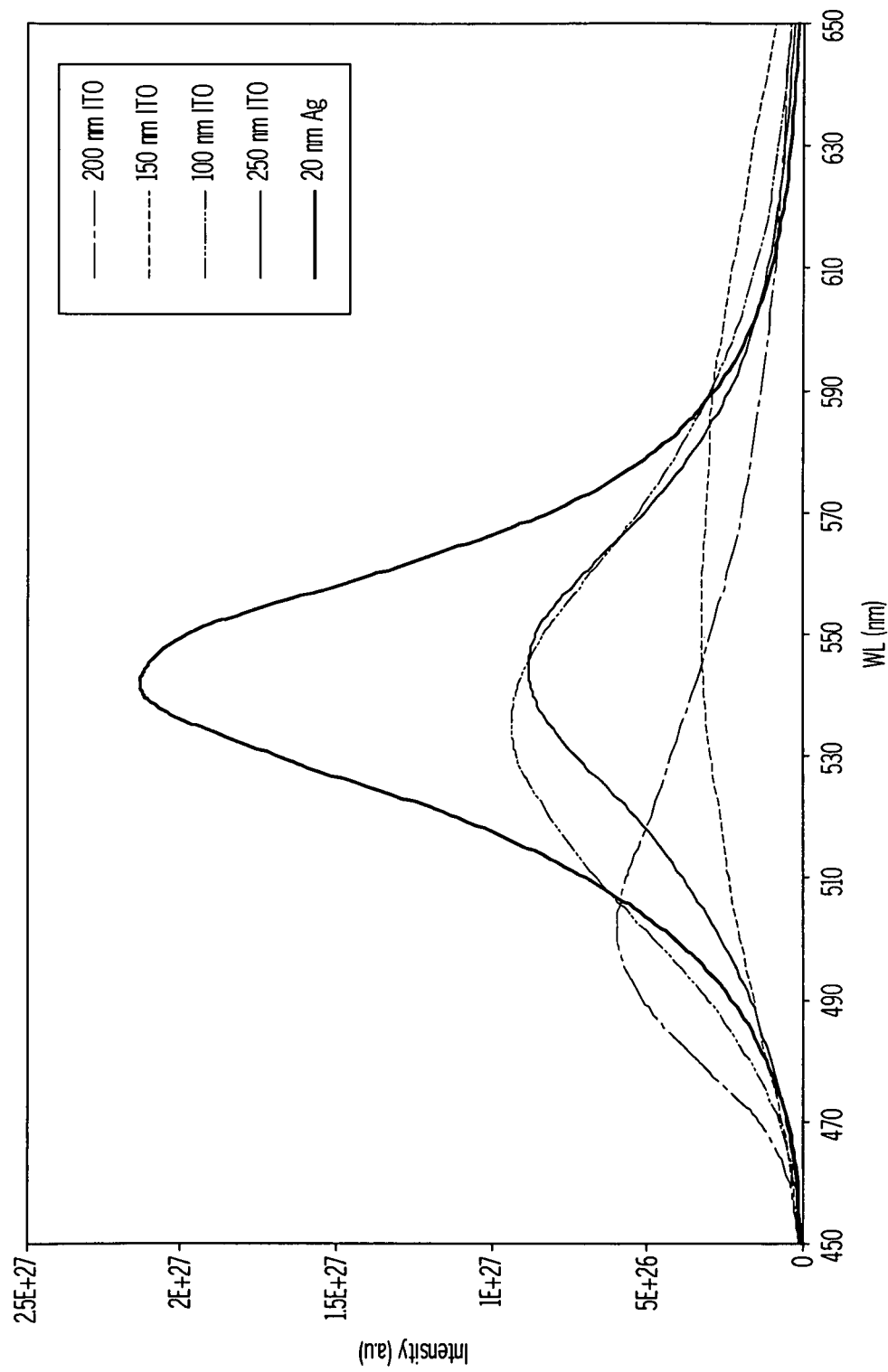
FIG. 4 is a graph showing the effect of various types and thicknesses of cathode layers on intensity and spectral distribution of the emitted light.

In order to show the effects of barrier structures with an increased light output, the light output of the OLED was optimized using the simulation by varying the cathode thickness. As is usual for a top emission OLED, a double layered cathode including a transparent ITO layer and a semi-transparent Ag layer was used. The Ag layer is added to increase the conductivity of the cathode. The light output from the OLED having a Ag cathode and from OLEDs having different thicknesses of indium tin oxide (ITO) cathode was compared, as shown in FIG. 4. The reflectivity and thickness of the cathode influence the intensity and the position of the TE-OLED emitted light. The OLED structure with a semitransparent Ag cathode gave the highest output intensity. For the ITO cathodes, the peak intensity of light output and the peak position depend on the thickness of the ITO layer. The optimum output (highest light output, and no spectral shift) was provided by a 100 nm thick ITO layer.

Example 5

Optimization of the barrier stack using the simulation was considered next. The barrier structure used was 50 nm LiF/inorganic oxide barrier layer (40 nm)/3 barrier stacks (polymeric decoupling layer (1pm)/inorganic oxide barrier layer (40 nm))/1 µm polymeric decoupling layer, and the cathode was Ag (20 nm). The thickness of the initial inorganic barrier layer, and the polymeric decoupling layer, and inorganic oxide barrier layer of the barrier stacks were varied.

Figure 5A:
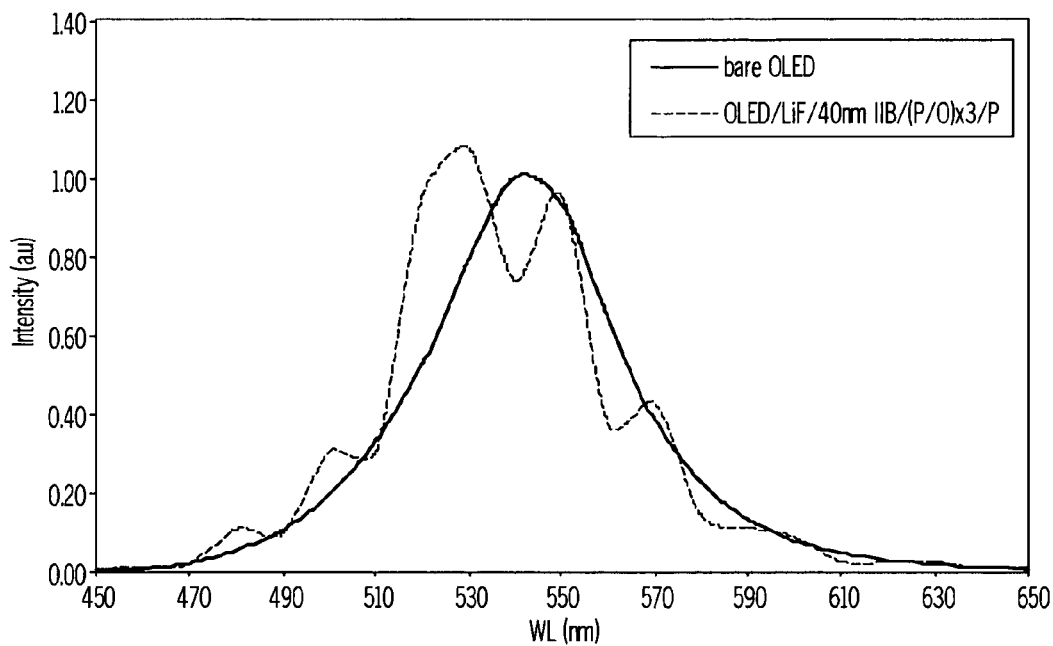
FIG. 5A-5C are graphs showing the effect of the thickness of an initial inorganic barrier layer on intensity and spectral distribution of the emitted light for an OLED with a Ag cathode.
Figure 5B:
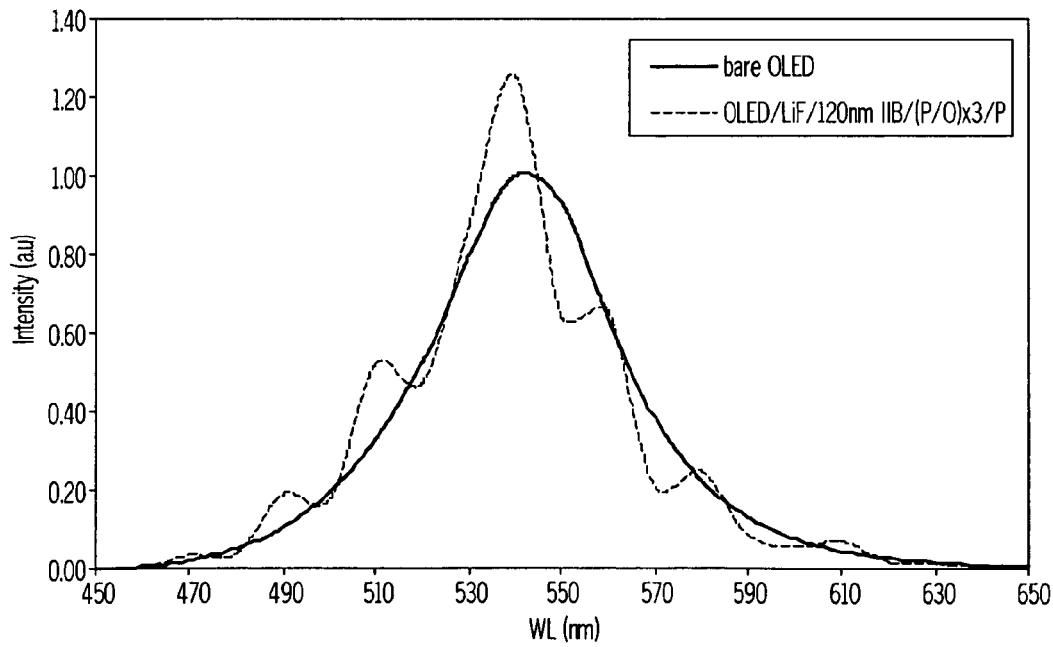
Figure 5C:
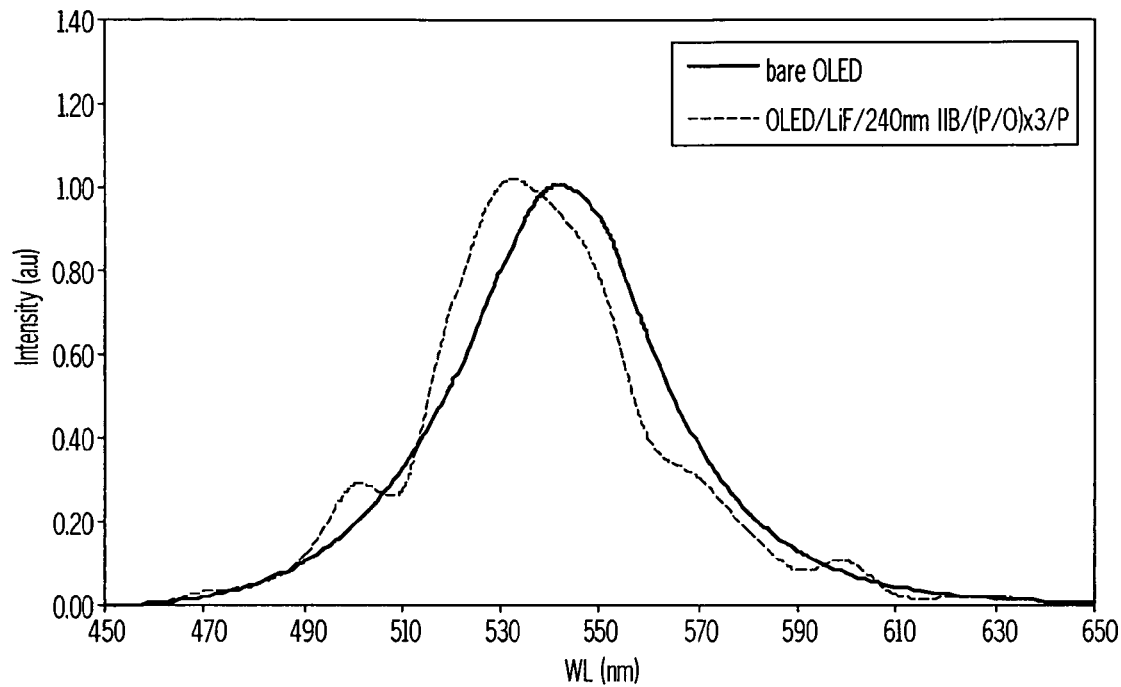
Figure 6A:
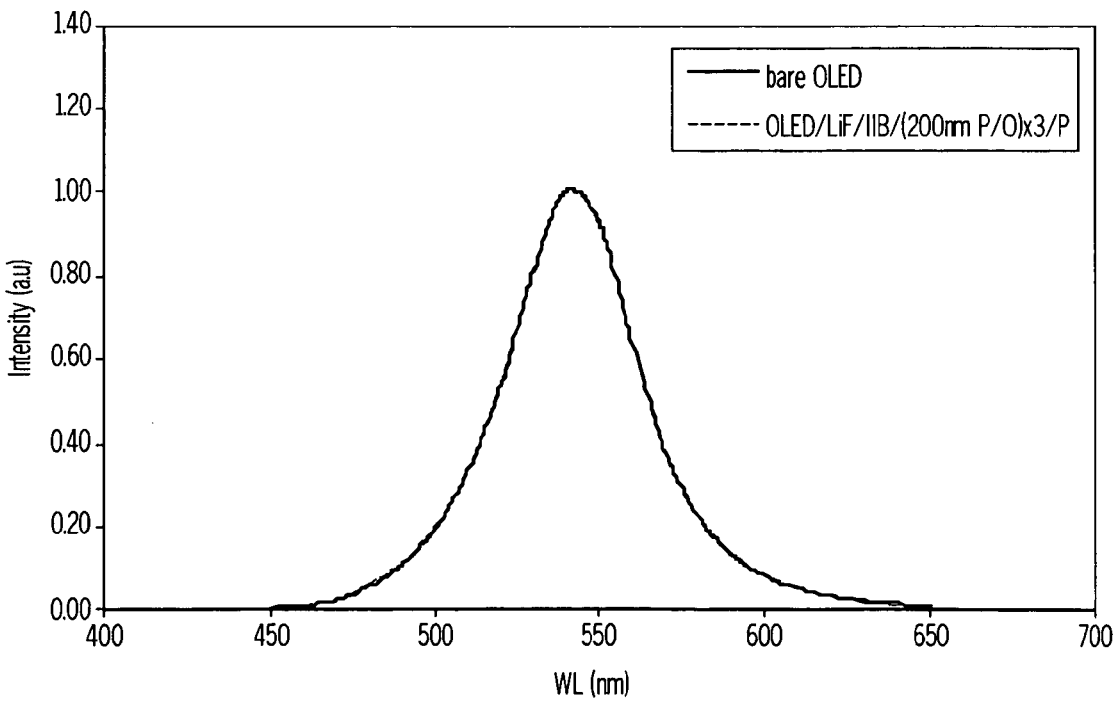
FIG. 6A-6E are graphs showing the effect of the thickness of the polymeric decoupling layer in the barrier stack on intensity and spectral distribution of the emitted light for an encapsulated OLED with a Ag cathode.
Figure 6B:
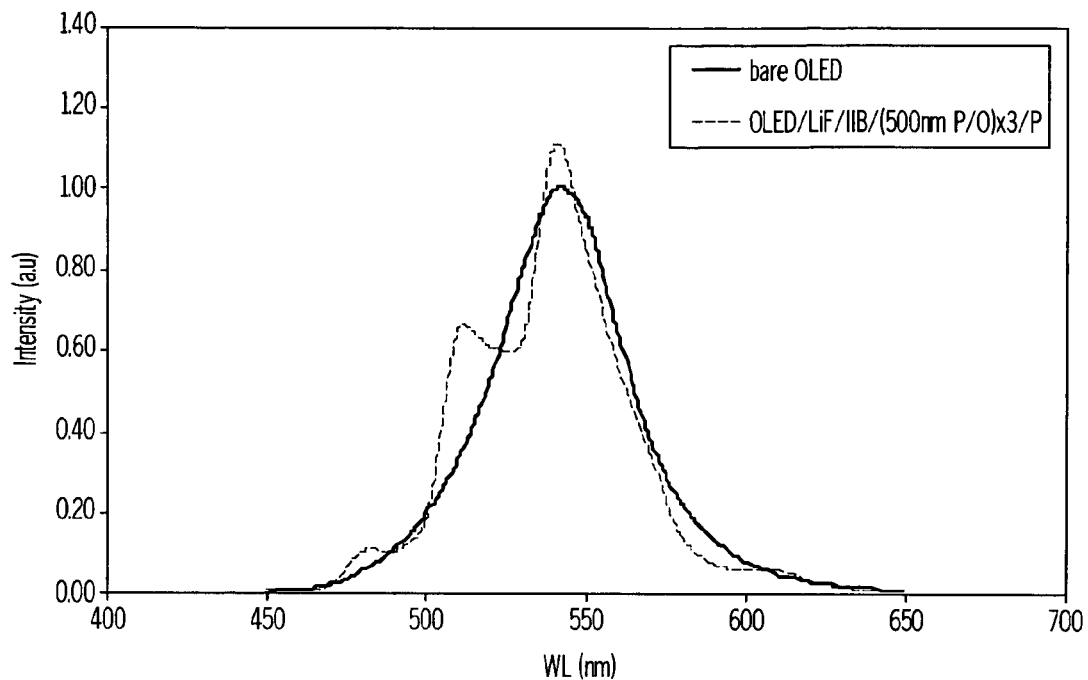
Figure 6C:
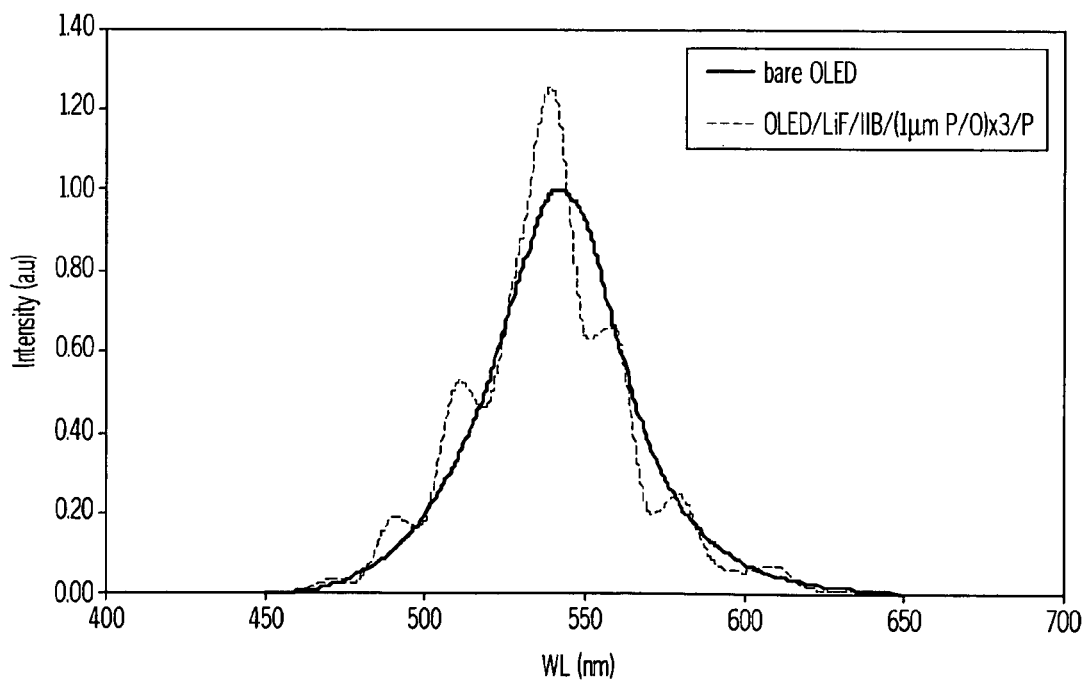
Figure 6D:
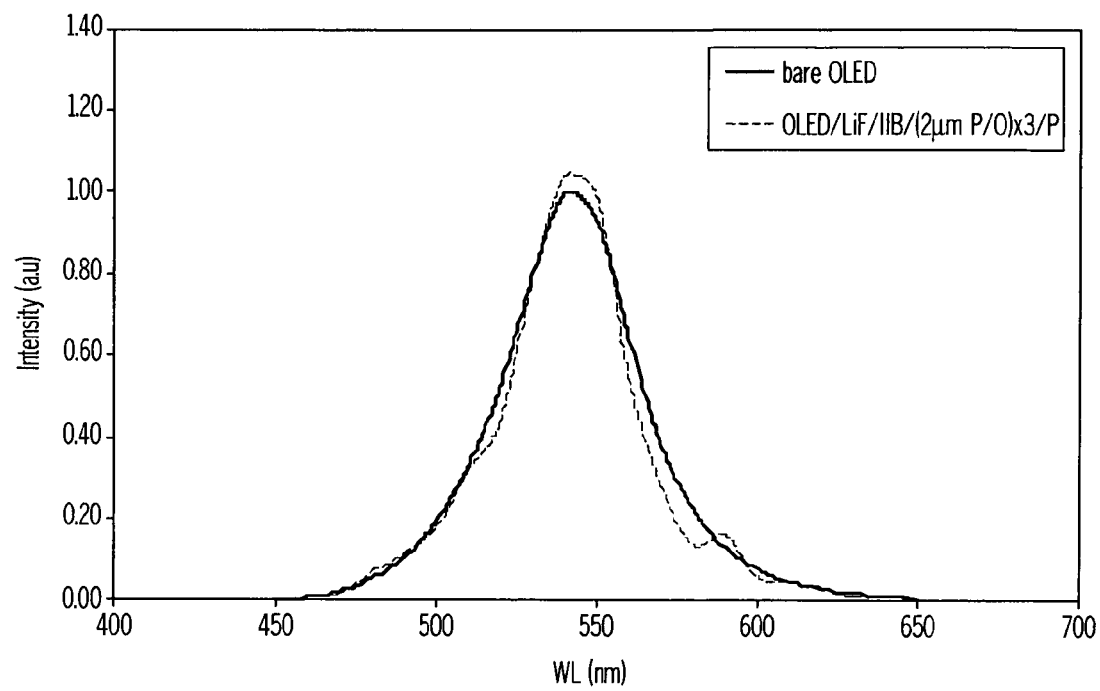
Figure 6E:
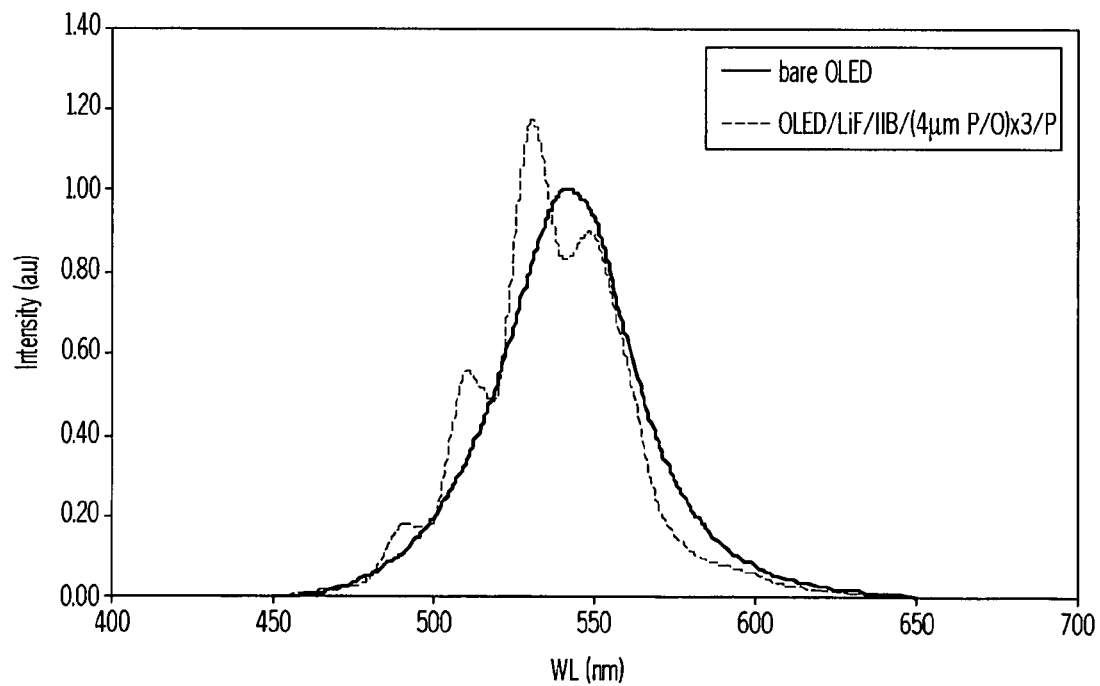
Figure 7A:
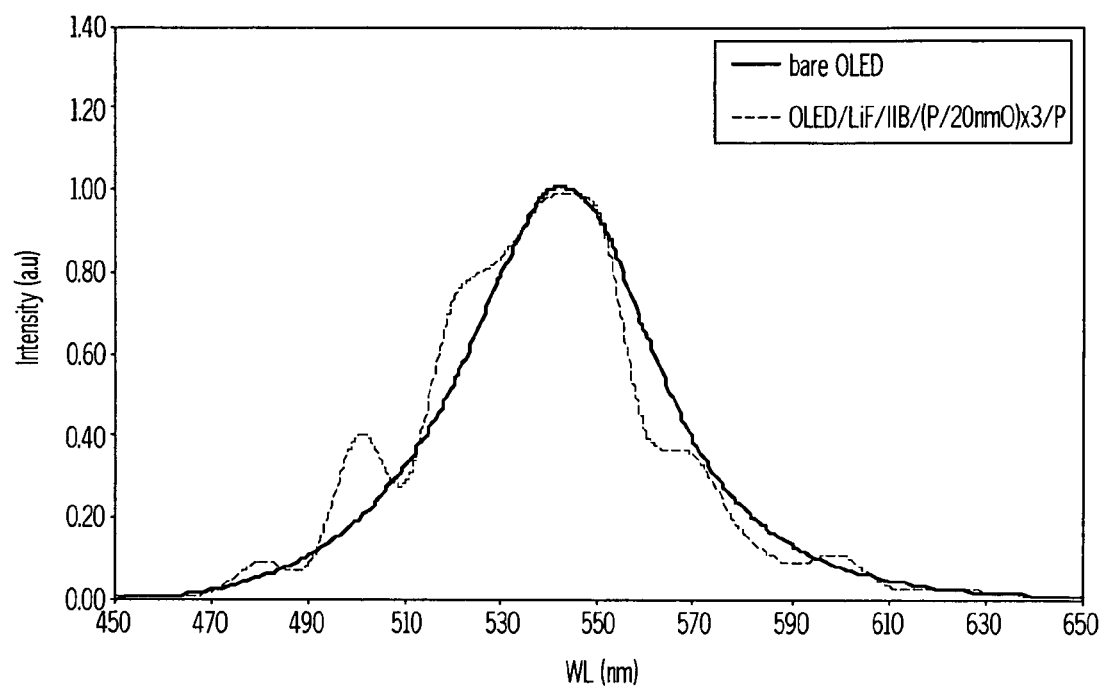
FIG. 7A-7D are graphs showing the effect of the thickness of the inorganic barrier layer in the barrier stack on intensity and spectral distribution of the emitted light for an encapsulated OLED with a Ag cathode.
Figure 7B:
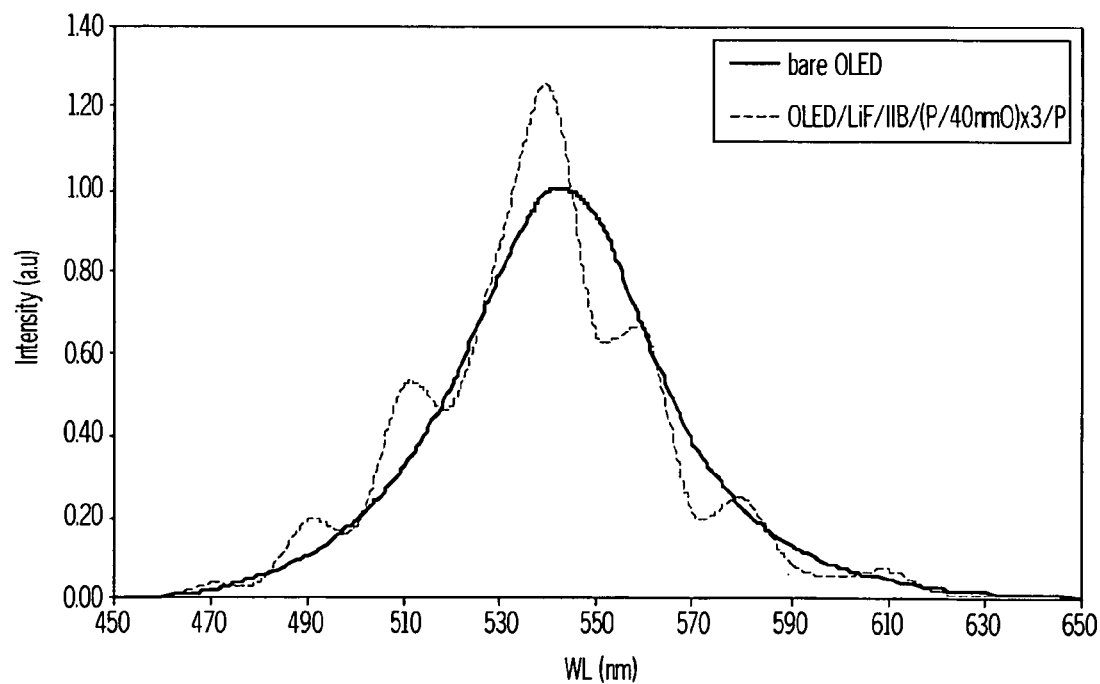
Figure 7C:
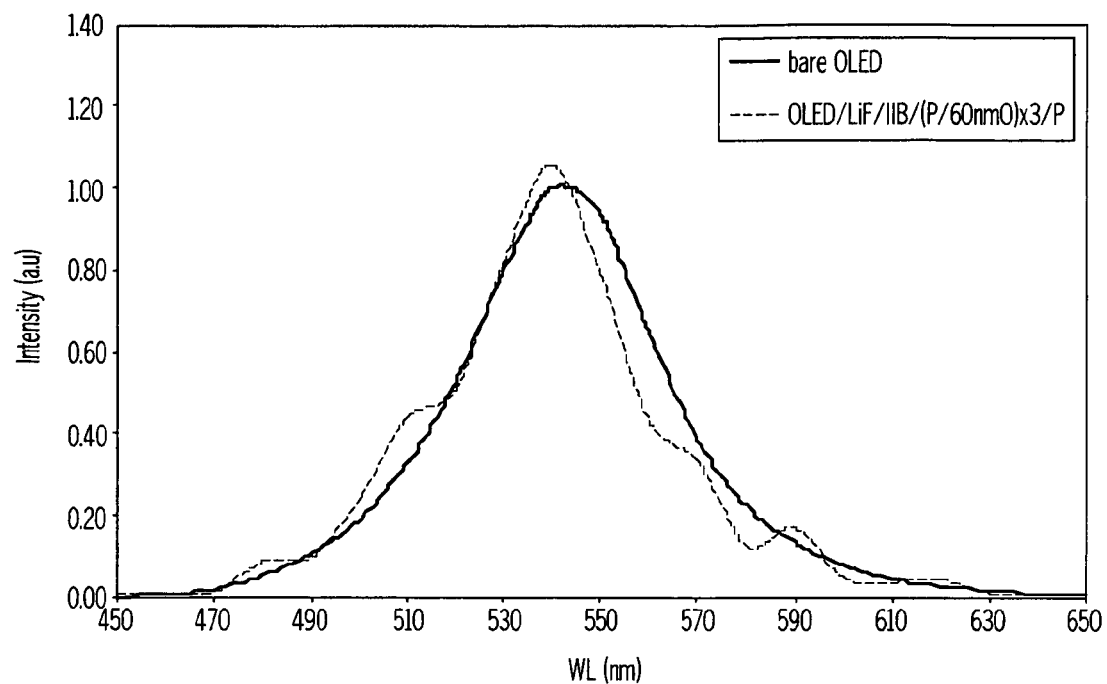
Figure 7D:
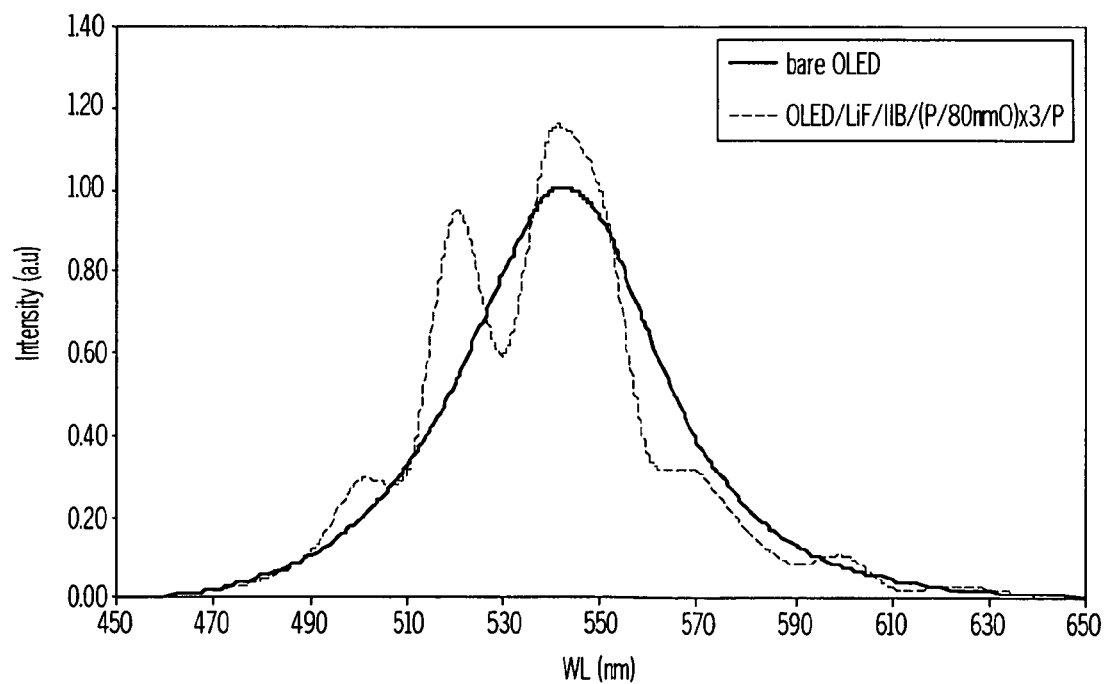

FIGS. 5A-5C show the effect of changing the thickness of the initial inorganic barrier layer. Each of the three barrier stacks had 1 µm polymeric decoupling layers, and 40 nm inorganic oxide barrier layers. The use of 120 nm thick initial inorganic barrier layer provided the highest peak intensity, best color purity, and minimum spectral shift. It enhances the peak intensity by 20%.

FIGS. 6A-6E show the effect of varying the thickness of the polymeric decoupling layer in the barrier stack. The initial inorganic barrier layer was 120 nm thick, and the inorganic oxide barrier layer in the barrier stacks was 40 nm. A 1 µm polymer thickness gave the highest peak intensity, best color purity, and minimum spectral shift. The combined effects of these improvements enhances the intensity by 30%.

FIGS. 7A-7D show the effect of different thicknesses of the inorganic oxide barrier layer in the barrier stack. The initial inorganic barrier layer was 120 nm thick, and the polymeric decoupling layer in the barrier stack was 1 µm. The 40 nm inorganic oxide barrier layer thickness provided the highest peak intensity, best color purity, and minimum spectral shift. This shows that with a fully optimized barrier and optical enhancement structure a 40% increase can be reached.

Figure 8A:
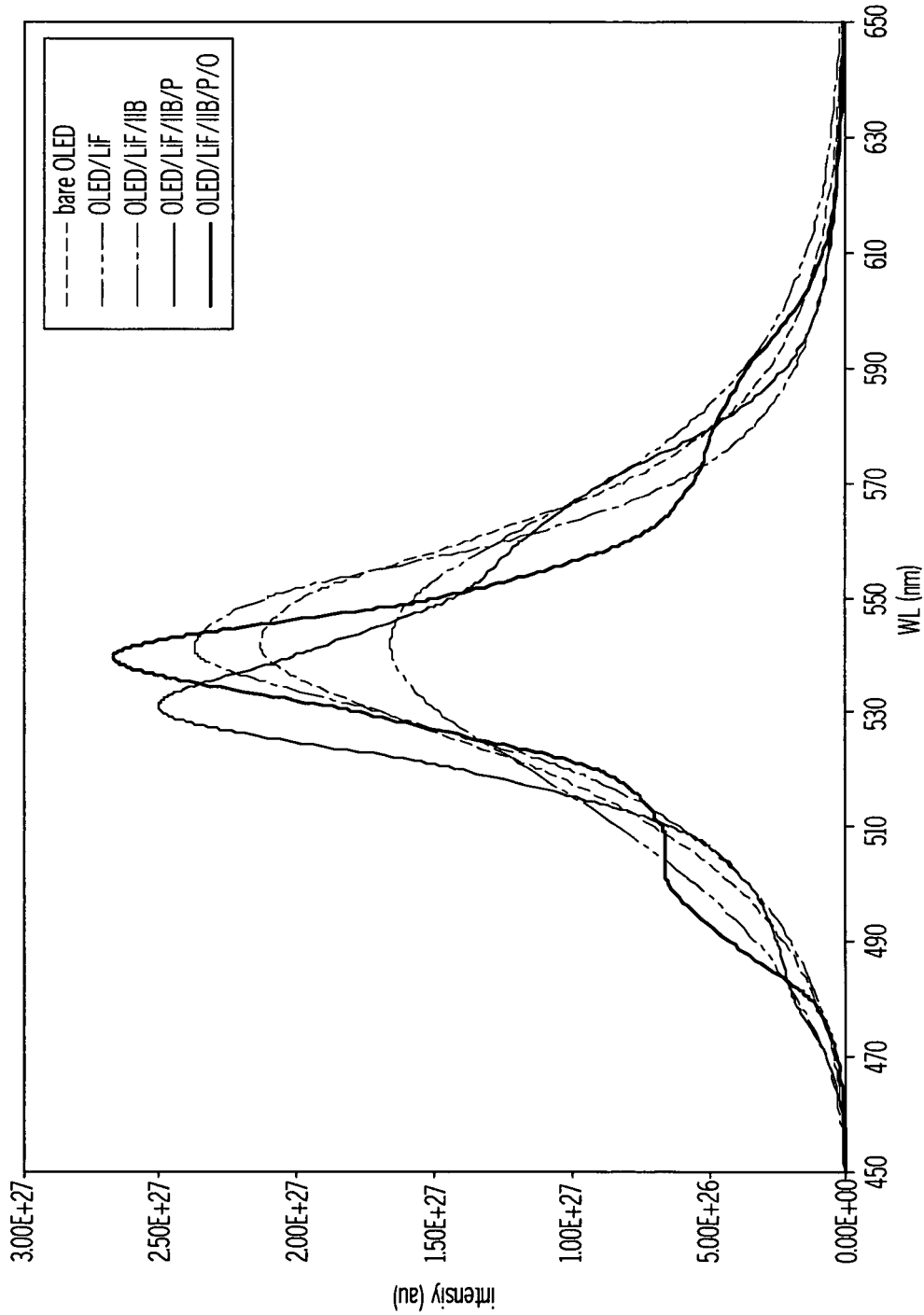
FIG. 8A-8B are graphs showing the optimization of an encapsulated OLED with a Ag cathode.
Figure 8B:
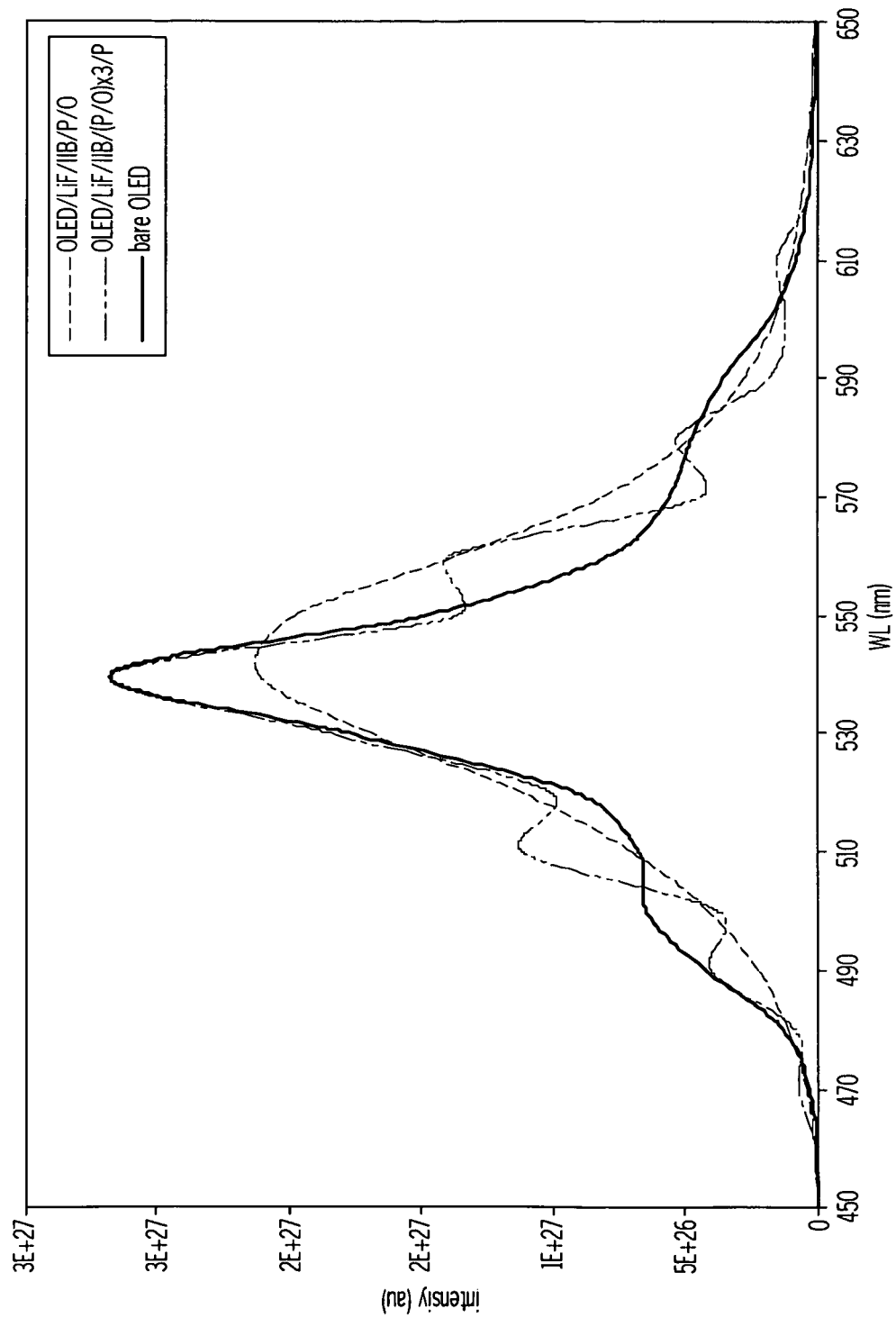

FIGS. 8A-8B show the effect of adding layers to the OLED encapsulation structure. 50 nm LiF inorganic plasma protective layer, 120 nm initial inorganic oxide barrier layer, barrier stacks with 1 μm polymeric decoupling layer and 40 nm inorganic oxide barrier layer, and 1 μm polymeric decoupling layer were used.

FIG. 8A shows that a substantial increase in efficiency can be obtained using the correct design rules for the barrier and optical enhancement stack. As shown in FIG. 8B, adding more barrier layers does not affect the light output.

The two plots show how OLED encapsulation can be optimized. Starting with a defined OLED structure including the cathode, consider layers for protecting the OLED and good barrier performance (LiF inorganic plasma protective layer and initial inorganic barrier layer for better coverage). Optimize the thicknesses of these layers to achieve better color definition and light output close to the photoluminescence peak. Add one or more barrier stacks with polymeric decoupling layers and inorganic oxide barrier layers, optimizing the layer thicknesses to maintain similar intensity. The number of barrier stacks is determined by the barrier performance needed for the particular application.

Example 6

Figure 9:
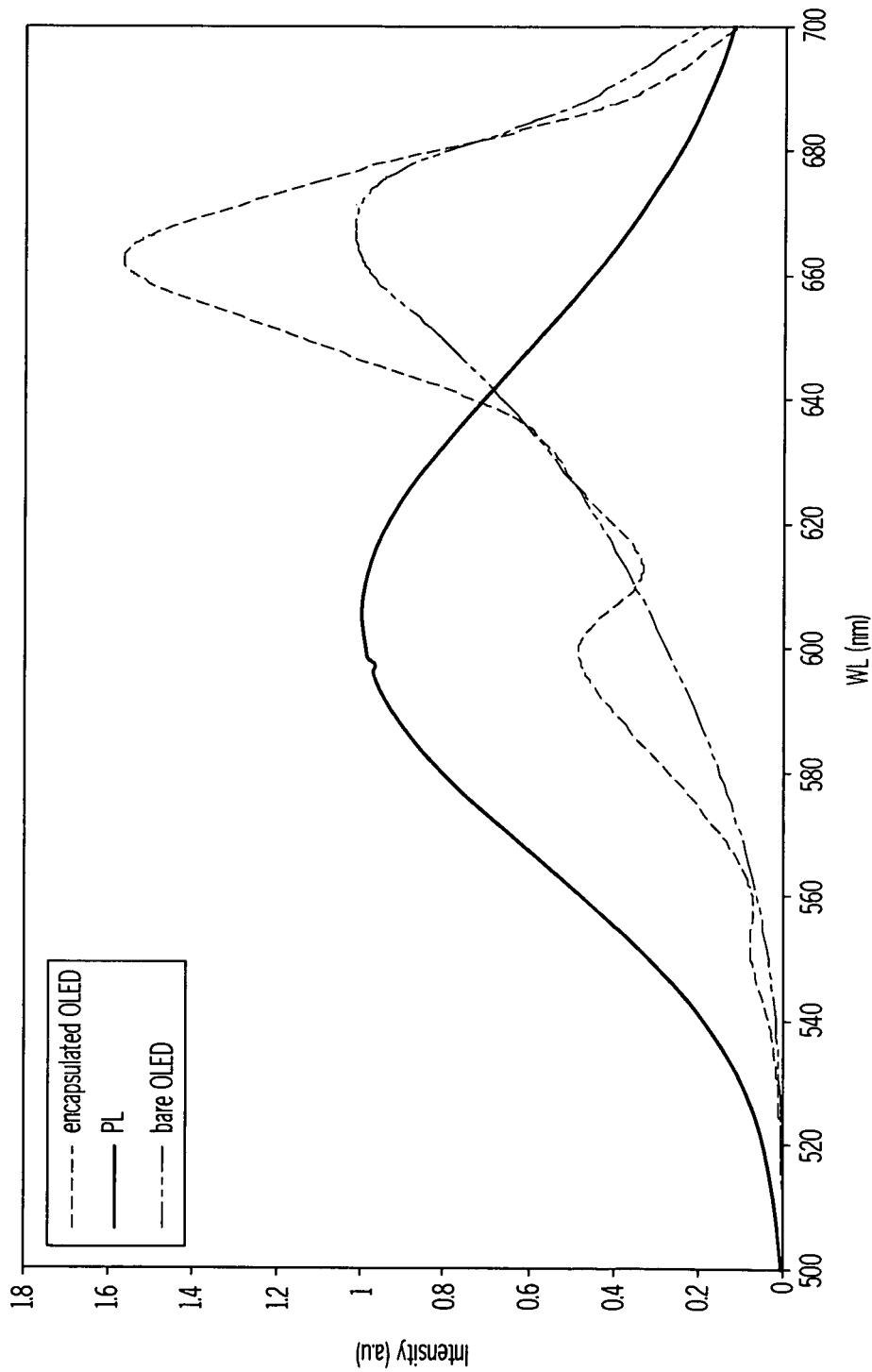
FIG. 9 is a graph showing the intentional shifting of light emission for an encapsulated OLED.

The simulation in FIG. 9 shows that with the proper design of the integrated optical structure defined by an encapsulated OLED, it is possible to obtain an OLED with intentionally shifted emission, purer color, and enhanced emission. The cathode is 20 nm Ag, the inorganic plasma protective layer is 50 nm LiF, the initial inorganic oxide barrier layer is 120 nm, there are three barrier stacks with 2 μm polymeric decoupling layers, and 40 nm inorganic oxide barrier layers, and a 1 μm polymeric decoupling layer. The photoluminescent layer is DCJTB (4-(dicyanomethylene)-2-t-butyl-6 (1,1,7,7-tetramethyljulolidyl-9-enyl)-4 Hpyran) which has a broad orange/yellow light emission. The resulting encapsulated OLED has a red emission with peak intensity 1.6 times higher than the unencapsulated OLED.

Example 7

Figure 10:
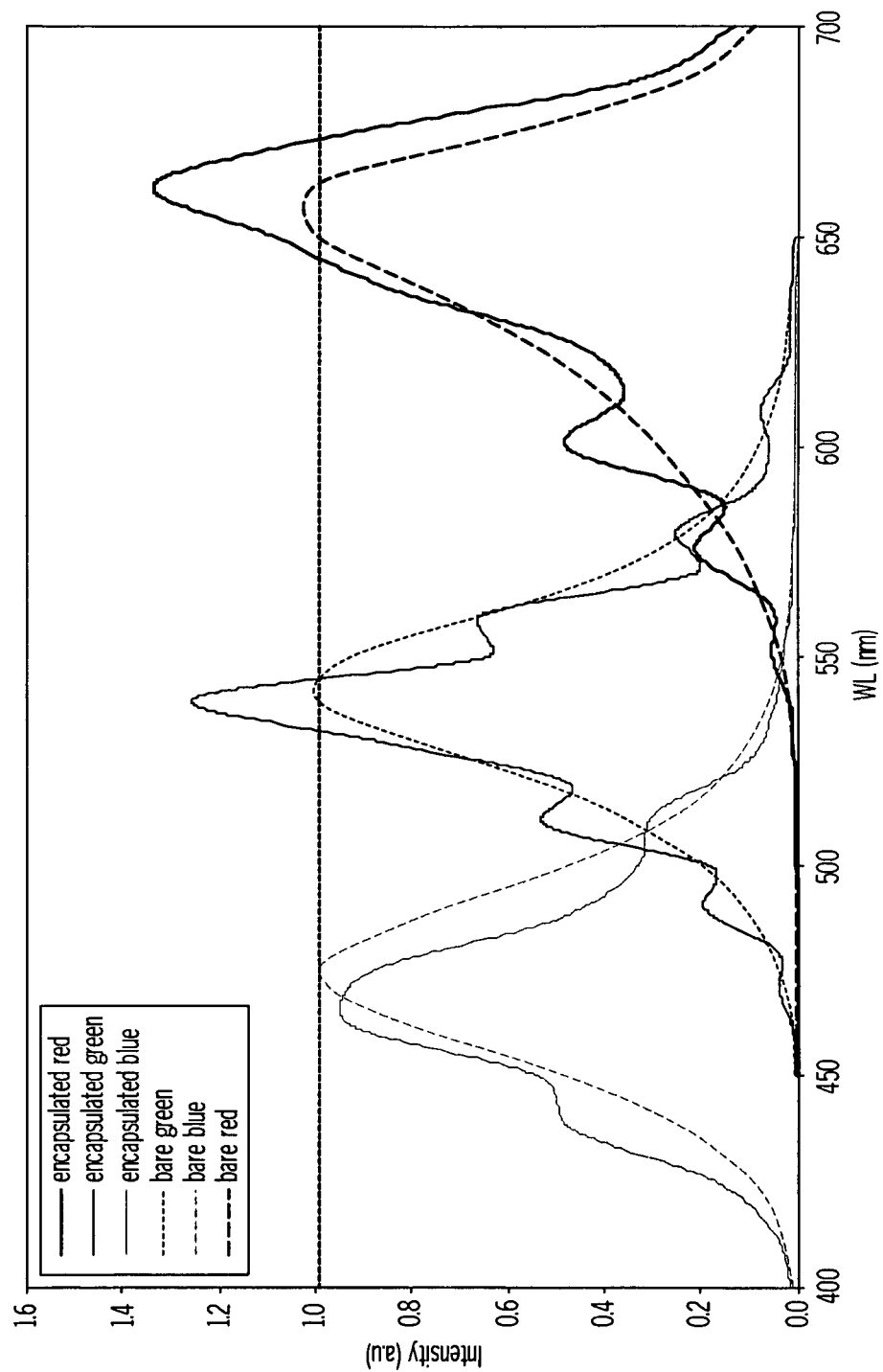
FIG. 10 is a graph comparing the light output for a RBG OLED with and without encapsulation.

The simulation of FIG. 10 compares the light output (at 90°) for RGB OLEDs with and without encapsulation. For each color, the intensity is normalized to the output of the OLED (at 90°). The structure used in the encapsulation was 50 nm LiF inorganic plasma protective layer/120 nm initial inorganic oxide barrier layer/3 barrier stacks with 1 μm polymeric decoupling layer and 40 nm inorganic oxide barrier layer/1 μm polymeric decoupling layer. This structure enhanced the light output for the green and the red OLEDs. For the blue OLED, the intensity of the encapsulated OLED was similar to that emitted by the bare unencapsulated OLED.

This example shows that it is possible to enhance the light output for two colors while not negatively affecting the light output of the third color. The overall output has been increased by 30%.

Table 1 shows the enhancement of the structure described above with variations in the layer thicknesses as shown. The normalized intensity of the emission peak at 0° is reported in the table. The normalization is to the bare unencapsulated OLED (with no additional layers).

By choosing the proper combination of layer thicknesses, it is possible to keep the ratio of intensities for the three colors similar (e.g., within about 10%) to that of the corresponding bare OLED. Alternatively, it is possible to enhance/reduce the light output of one or two colors compared to the other(s).

TABLE 1

| First Oxide Thickness (nm) | Alq3[1] | BAlq3[2] | DJCTB[3] |
|---|---|---|---|
| 240 | 1 | 1.1 | 1.3 |
| 120 | 1.3 | 0.8 | 1.3 |
| 40 | 1.1 | 0.9 | 1.3 |
| Interlayer Oxide thickness (nm) | Alq3 | BAlq3 | DJCTB |
| 20 | 1 | 1.1 | 1.6 |
| 40 | 1.2 | 0.9 | 1.3 |
| 60 | 1.1 | 0.8 | 1.7 |
| 80 | 1.1 | 1.2 | 1.4 |
| Interlayer Poly Thickness (um) | Alq3 | BAlq3 | DJCTB |
| 0.2 | 1 | 1.1 | 1.1 |
| 0.5 | 1.1 | 0.8 | 1.6 |
| 1 | 1.3 | 0.8 | 1.3 |
| 2 | 1.1 | 0.9 | 1.6 |
| 4 | 1.2 | 1.1 | 1.5 |

[1] Alq3 = aluminum tris(8-hydroxyquinoline)
[2] BAlq3 = bis(2-methyl-8-quinolinolato-N1,O8)-(1,1'-biphenyl-4-olato) aluminum
[3] DJCTB = 4-(dicyanomethylene)-2-t-butyl-6 (1,1,7,7-tetramethyljulolodyl-9-enyl)-4 Hpyran Example 8

Figure 11:
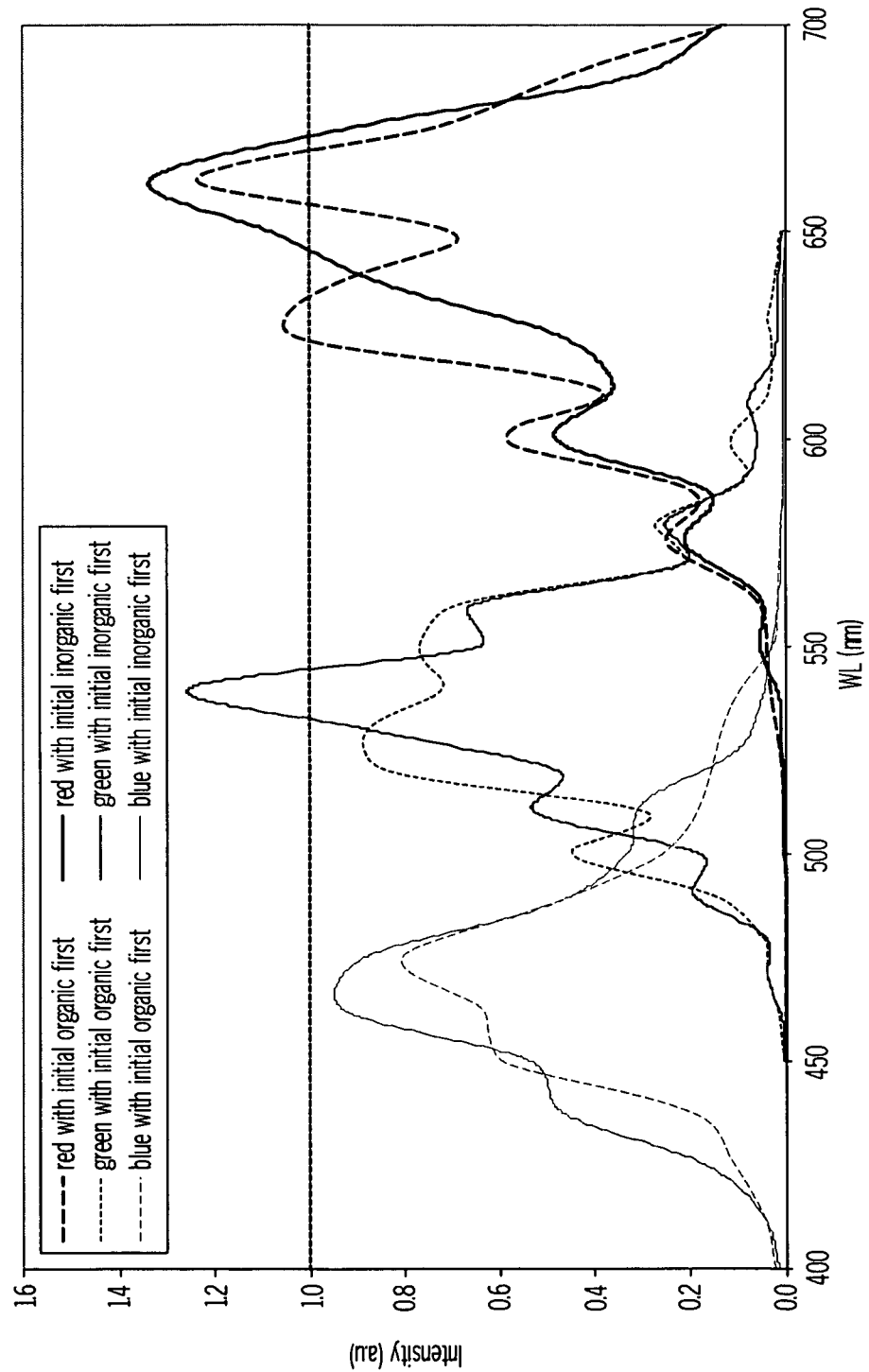
FIG. 11 is a graph comparing the effect of an initial inorganic barrier layer with an initial polymeric layer on intensity and spectral distribution of the emitted light for an encapsulated OLED.

The simulation in FIG. 11 compares the effect of an initial inorganic barrier layer with an initial organic layer. The structure contained either 120 nm initial inorganic barrier layer or 1 μm thick initial organic layer with 3 barrier stacks having 2 μm polymeric decoupling layers and 40 nm inorganic oxide barrier layers. The initial organic layer had an RI of 1.5.

The use of an initial low RI organic layer as the first layer in the stack compromises the peak intensity of emitted light. In the plots, the intensity has been normalized to the intensity of the bare unencapsulated OLED.

As FIG. 11 shows, not all barrier stacks will show an optical enhancement. For example, starting with an initial organic layer results in decreased light output. Thus, it is necessary to follow the design rules for the integrated barrier and optical enhancement stack.

Example 9

Example 9 shows another possible barrier layer which has a negative effect on the efficiency and spectral purity of the emission from the device.

Figure 12:
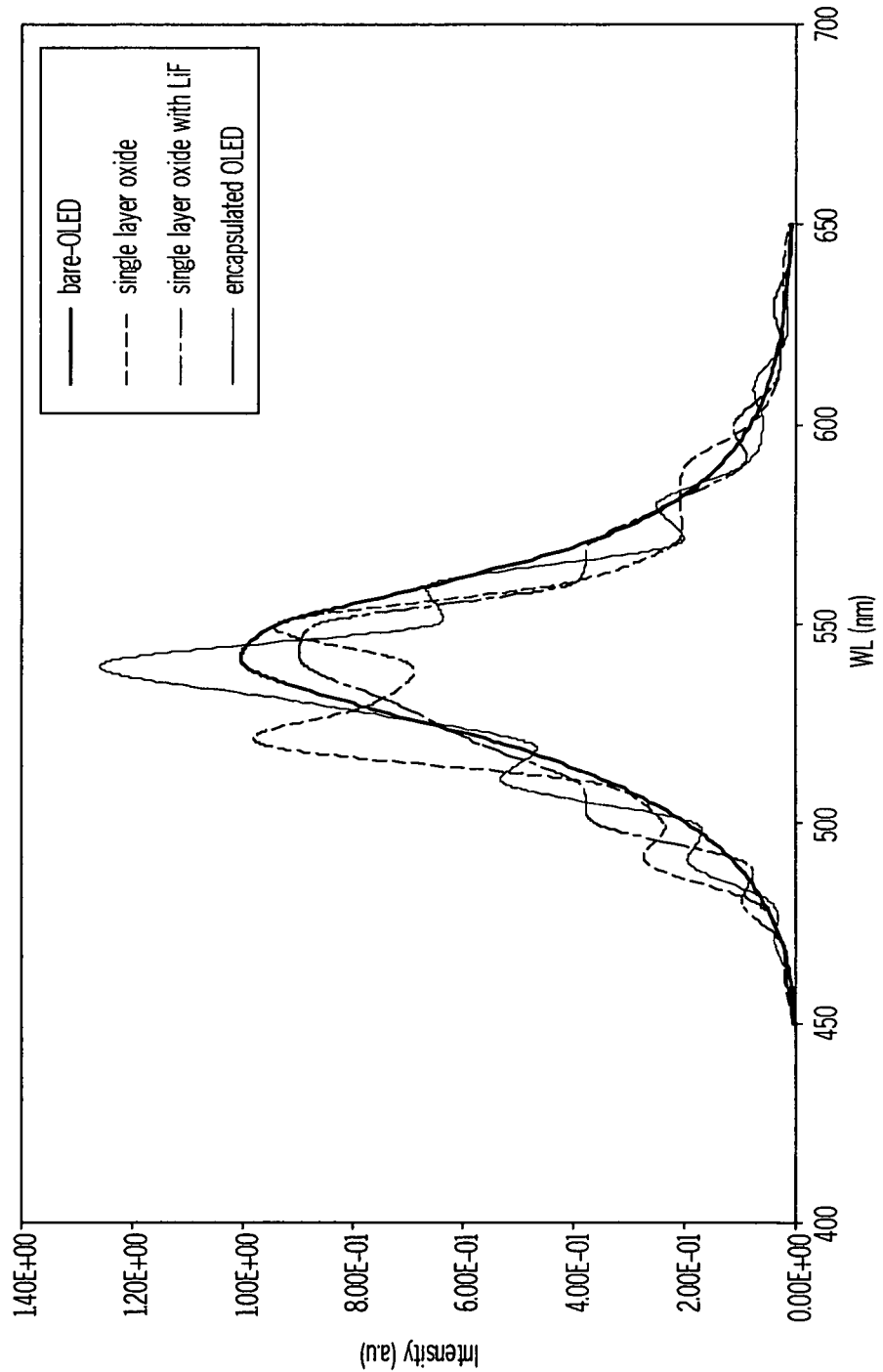
FIG. 12 is a graph comparing the effect of encapsulating an OLED with a single inorganic barrier layer with multiple barrier stacks.

The simulation in FIG. 12 compares the effect of a single inorganic barrier layer with a multilayer structure. One sample had a 2 μm single layer of an inorganic oxide barrier layer. Another had a 50 nm LiF plasma protective layer and a 2 μm single layer of an inorganic oxide barrier layer. The multilayer structure included a 50 nm LiF inorganic plasma protective layer, 120 nm initial inorganic oxide barrier layer, and 3 barrier stacks with 2 μm polymeric decoupling layer and 40 nm inorganic oxide barrier layer.

The intensity enhancement and color purity were better for the multilayer structure than for the single layer inorganic barrier layer.

Example 10

Figure 13:
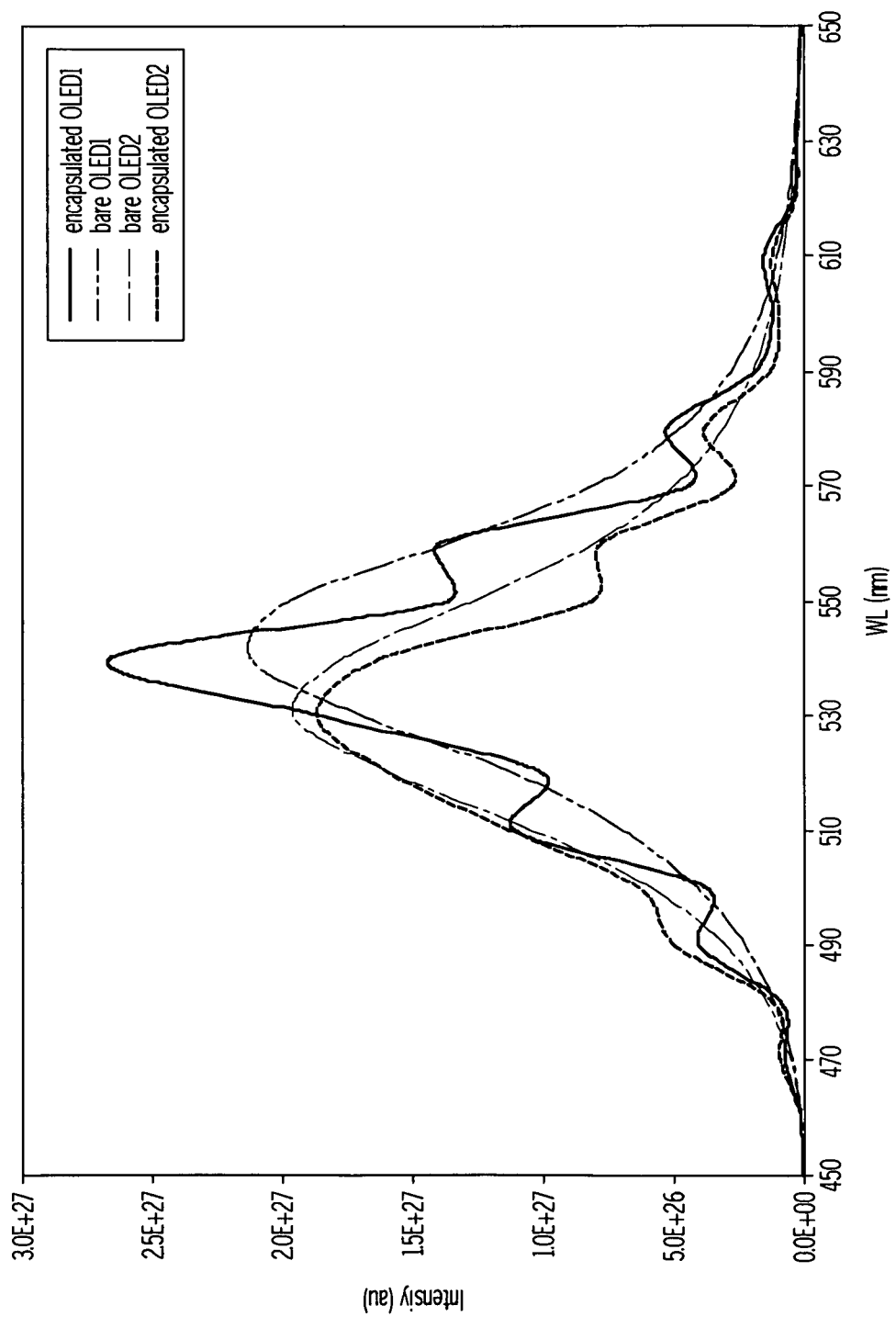
FIG. 13 is a graph comparing the effect of encapsulating different OLEDs with the same barrier stack.

The simulation in FIG. 13 compares two OLEDs having different layer thicknesses encapsulated with the same structure. The structure contains 50 nm LiF inorganic plasma protective layer/120 nm initial inorganic barrier layer (RI=1.65)/3 barrier stacks with 1 μm polymeric decoupling layer (RI=1.5) and 40 nm inorganic oxide barrier layer (RI=1.65)/1 μm polymeric decoupling layer (RI=1.5).

One OLED had 80 nm Ag/50 nm HT (RI=1.766)/50 nm Alq3/20 nm Ag. The second OLED had 80 nm Ag/65 nm HT (RI=1.766)/30 nm Alq3/20 nm Ag.

Although the intensity of the unencapsulated OLEDs was similar (+/− about 10%), the intensity of the encapsulated OLEDs differed by about 30%. Thus, the barrier structure needs to optimized for the specific OLED to be used.

Just as it is possible to enhance the optical outcoupling of a top emission OLED using an integrated barrier and optical enhancement stack, it is also possible to enhance the efficiency of bottom emission devices by building them on a barrier stack. For example, the structure could be: 1) transparent substrate (e.g., glass or plastic); 2) integrated barrier and optical enhancement stack; 3) anode of OLED (e.g., ITO); 4) OLED organic emission layers; and 5) cathode of OLED (e.g., low work function metal combined with aluminum). The same design rules can be applied to this situation. This is a particularly attractive solution when the substrate is a flexible plastic layer so that an efficient flexible display can be made.

As would be understood by those of skill in the art, the integrated barrier and optical enhancement stack would be adjacent to the transparent electrode in the OLED. In a top emitting OLED structure, the transparent electrode would be the cathode, while in a bottom emitting OLED structure, the transparent electrode would be the anode.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. A method of making an integrated barrier and optical enhancement stack for protecting and improving the light out coupling of an encapsulated OLED comprising;
    providing an OLED having at least two colors selected from red, green, or blue, and a transparent electrode;
    selecting an initial inorganic barrier layer having a refractive index in a range of about 1.55 to about 2, the initial inorganic barrier layer adjacent to the transparent electrode in the OLED;
    providing a thickness of the initial inorganic barrier layer for the OLED within a range of about 40 nm to about 240 nm;
    selecting a barrier stack comprising an inorganic barrier layer and a polymeric decoupling layer, the inorganic barrier layer having a refractive index in a range of about 1.55 to about 2, and the polymeric decoupling layer having a refractive index in a range of about 1.4 to about 1.65, the barrier stack adjacent to the initial inorganic barrier layer;
    providing a thickness of the inorganic barrier layer within a range of about 20 nm to about 80 nm and the polymeric decoupling layer of the barrier stack within a range of about 0.2 μm to about 4 μm;
    optimizing the thickness of at least one of the initial inorganic barrier layer, the inorganic barrier layer, or the polymeric decoupling layer for at least one of maximum efficiency, minimum dispersion, or minimum spectral shift, so that the encapsulated OLED has enhanced light outcoupling compared to a bare OLED, said optimizing being achieved without use of either (a) a scattering layer placed adjacent the OLED, initial inorganic barrier layer or barrier stack or (b) a quarter-wave stack placed adjacent the OLED, initial inorganic barrier layer or barrier stack;
    depositing the initial inorganic barrier layer having the optimized thickness adjacent to the transparent electrode of the OLED; and
    depositing the barrier stack having the optimized thickness adjacent to the initial inorganic layer.

2. The method of claim 1 further comprising:
    selecting a plasma protective layer having a refractive index in a range of about 1.1 to about 1.9; and
    optimizing a thickness of the plasma protective layer for the OLED within a range of about 20 nm to about 50 nm;
    wherein the thickness of the plasma protective layer is optimized for at least one of maximum efficiency, minimum dispersion, or minimum spectral shift, and
    wherein the plasma protective layer is positioned between the OLED and the initial inorganic barrier layer;
    depositing the plasma protective layer having the optimized thickness adjacent to the transparent electrode of the OLED before the initial inorganic barrier layer is deposited.

3. The method of claim 2 wherein the plasma protective layer is an inorganic layer.

4. The method of claim 1 wherein the transparent electrode in the OLED is a transparent cathode.

5. The method of claim 4 wherein providing the OLED includes:
    selecting the transparent cathode layer, the transparent cathode layer having a refractive index in a range of about 1.6 to about 2; and
    optimizing a thickness of the transparent cathode layer within a range of about 20 to about 300 nm,
    and wherein the thickness of the transparent cathode layer is optimized for at least one of maximum efficiency, minimum dispersion, or minimum spectral shift.

6. The method of claim 1 wherein the maximum efficiency or total efficiency is increased by at least about 20% compared to the bare OLED.

7. The method of claim 1 wherein the maximum efficiency or total efficiency is increased by at least about 40% compared to the bare OLED.

8. The method of claim 1 wherein the maximum efficiency or total efficiency is increased by at least about 50% compared to the bare OLED.

9. The method of claim 1 wherein the transparent electrode in the OLED is a transparent anode.

10. The method of claim 1 wherein the encapsulated OLED exhibits an intentional spectral shift.

11. A method of making an integrated barrier and optical enhancement stack for protecting and improving the light out coupling of an encapsulated OLED comprising;
    providing an OLED having at least two colors selected from red, green, or blue, and a transparent electrode;
    selecting a plasma protective layer having a refractive index in a range of about 1.1 to about 1.9, the plasma protective layer adjacent to the transparent electrode in the OLED;
    optimizing a thickness of the plasma protective layer for the OLED within range of about 20 nm to about 50 nm;

selecting an initial inorganic barrier layer having a refractive index in a range of about 1.55 to about 2, the initial inorganic barrier layer adjacent to the plasma protective layer;

providing a thickness of the initial inorganic barrier layer for the OLED within a range of about 40 nm to about 240 nm;

selecting a barrier stack comprising an inorganic barrier layer and a polymeric decoupling layer, the inorganic barrier layer having a refractive index in a range of about 1.55 to about 2, and the polymeric decoupling layer having a refractive index in a range of about 1.4 to about 1.5, the barrier stack adjacent to the initial inorganic barrier layer;

providing a thickness of the inorganic barrier layer within a range of about 20 nm to about 80 nm and the polymeric decoupling layer of the barrier stack within a range of about 0.2 μm to about 4 μm;

optimizing the thickness of at least one of the plasma protective layer, the initial inorganic barrier layer, the inorganic barrier layer, or the polymeric decoupling layer for at least one of maximum efficiency, minimum dispersion, or minimum spectral shift so that the encapsulated OLED has enhanced light outcoupling compared to a bare OLED, said optimizing being achieved without use of either (a) a scattering layer placed adjacent the OLED, initial inorganic barrier layer or barrier stack or (b) a quarter-wave stack placed adjacent the OLED, initial inorganic barrier layer or barrier stack;

depositing the plasma protective layer having the optimized thickness adjacent to the transparent electrode of the OLED;

depositing the initial inorganic barrier layer having the optimized thickness adjacent to the plasma protective layer; and depositing the barrier stack having the optimized thickness adjacent to the initial inorganic barrier layer.

12. The method of claim 11 wherein the transparent electrode in the OLED is a transparent cathode.

13. The method of claim 12 wherein providing the OLED includes:
selecting a transparent cathode layer material, the transparent cathode layer material having a refractive index in a range of about 1.6 to about 2; and
optimizing a thickness of the transparent cathode layer within a range of about 20 to about 300 nm,
and wherein thickness of the transparent cathode layer is optimized for at least one of maximum efficiency, minimum dispersion, or minimum spectral shift.

14. The method of claim 11 wherein the maximum efficiency or total efficiency is increased by at least about 20% compared to the bare OLED.

15. The method of claim 11 wherein the maximum efficiency or total efficiency is increased by at least about 40% compared to the bare OLED.

16. The method of claim 11 wherein the maximum efficiency or total efficiency is increased by at least about 50% compared to the bare OLED.

17. The method of claim 11 wherein the plasma protective layer is an inorganic layer.

18. The method of claim 11 wherein the transparent electrode in the OLED is a transparent anode.

19. The method of claim 11 wherein the encapsulated OLED exhibits an intentional spectral shift.

20. The product made by the method of claim 1.

21. The product made by the method of claim 2.

22. The product made by the method of claim 11.

* * * * *